(12) United States Patent
Jiang et al.

(10) Patent No.: US 7,557,337 B2
(45) Date of Patent: Jul. 7, 2009

(54) MICRO-LENS CONFIGURATION FOR SMALL LENS FOCUSING IN DIGITAL IMAGING DEVICES

(75) Inventors: Tongbi Jiang, Boise, ID (US); Michael Connell, Boise, ID (US); Jin Li, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/257,041

(22) Filed: Oct. 25, 2005

(65) Prior Publication Data
US 2006/0033010 A1 Feb. 16, 2006

Related U.S. Application Data

(62) Division of application No. 10/667,390, filed on Sep. 23, 2003, now Pat. No. 7,115,853.

(51) Int. Cl.
*H01J 3/14* (2006.01)
(52) U.S. Cl. ...................... 250/216; 348/340
(58) Field of Classification Search ............ 250/208.1, 250/216; 348/272, 335–336, 340, 344, 273; 359/619, 618; 257/431–434
See application file for complete search history.

(56) References Cited

U.S. PATENT DOCUMENTS

| | | | |
|---|---|---|---|
| 5,371,397 A * | 12/1994 | Maegawa et al. | 257/432 |
| 5,672,519 A | 9/1997 | Song et al. | |
| 5,844,289 A * | 12/1998 | Teranishi et al. | 257/432 |
| 5,877,040 A | 3/1999 | Park et al. | |
| 5,976,907 A | 11/1999 | Shigeta et al. | |
| 6,030,852 A | 2/2000 | Sano et al. | |
| 6,057,538 A | 5/2000 | Clark | |
| 6,066,511 A | 5/2000 | Fukusyo | |
| 6,157,017 A * | 12/2000 | Kim | 250/208.1 |
| 6,252,219 B1 * | 6/2001 | Abe | 250/208.1 |
| 6,255,640 B1 * | 7/2001 | Endo et al. | 250/208.1 |
| 6,274,917 B1 * | 8/2001 | Fan et al. | 257/432 |
| 6,291,811 B1 | 9/2001 | Ogawa | |
| 6,381,072 B1 * | 4/2002 | Burger | 359/622 |

(Continued)

OTHER PUBLICATIONS

Air-Channel Fabriction for Microelectromechanical Systems Via Sacrificial Photosensitive Polycarbonates, Joseph Paul Jayachandran, Hollie A. Reed, Hongshi Zhen, Larry F. Rhodes, Clifford L. Henderson, Sue Ann Bidstrup Allen, and Paul A. Kohl, School of Chemical Engineering, Georgia Institute of Technology, Atlanta, GA (b) Promerus LLC, Brecksville, OH.

(Continued)

*Primary Examiner*—Georgia Y Epps
*Assistant Examiner*—Kevin Wyatt
(74) *Attorney, Agent, or Firm*—Dickstein Shapiro LLP

(57) ABSTRACT

An improved image sensor wherein a first micro-lens array comprised of one or more micro-lenses is positioned over a cavity such that incoming light is focused on the photo sensors of the image sensor. The first micro-lens array may collimate and focus incoming light onto the photo sensors of the image sensor, or may collimate incoming light and direct it to a second micro-lens array which then focuses the light onto the photo sensors. A method of fabricating the improved image sensor is also provided wherein the cavity and first micro-lens array are formed by use of a sacrificial material.

25 Claims, 35 Drawing Sheets

U.S. PATENT DOCUMENTS

| | | | |
|---|---|---|---|
| 6,605,850 B1* | 8/2003 | Kochi et al. | 257/431 |
| 2002/0124378 A1 | 9/2002 | Nemoto et al. | |
| 2003/0021034 A1* | 1/2003 | Yoshikawa et al. | 359/619 |
| 2003/0112522 A1* | 6/2003 | Fujimoto | 359/619 |
| 2003/0168679 A1 | 9/2003 | Nakai et al. | |
| 2003/0183893 A1* | 10/2003 | Li | 257/432 |

OTHER PUBLICATIONS

Fabrication of microchannels using polycarbonates as sacrificial materials, Hollie A. Reed, Celesta E. White, Vikram Rao, Sue Ann Bidstrup Allen, Clifford L. Henderson and Paul A. Kohl, School of Chemical Engineering, Georgia Institute of Technology, Atlanta, GA, Oct. 12, 2001, Journal of Micromechanics and Microengineering, Institute of Physics Publishing, J. Micromech, Microeng. 11 (2001) 733-737.

Fabrication of Air-Channel Structures for Microfluidic, Microelectromechanical, and Microelectronic Applications, Dhananjay Bhusari, Hollie A. Reed, Michael Wedlake, Agnes M. Padovani, Sue Ann Bidstrup Allen, and Paul A. Kohl, Member, IEEE, Journal of Microelectromechanical System, vol. 10, No. 3, Sep. 2001.

* cited by examiner

MICRO-LENS CONFIGURATION FOR SMALL LENS FOCUSING IN DIGITAL IMAGING DEVICES

CROSS-REFERENCE TO RELATED APPLICATION

This application is a divisional of U.S. patent application Ser. No. 10/667,390, filed on Sep. 23, 2003, the subject matter of which is incorporated in its entirety by reference herein.

BACKGROUND OF THE INVENTION

1. Field of the Invention

The present invention relates generally to micro-lenses for imager devices and to methods for producing the same.

2. Brief Description of the Related Art

Image sensing devices (i.e., image sensors) are known that employ light detecting elements (e.g., photo sensors) for use in various applications such as in semiconductor devices. Such image sensors may be formed using a variety of fabrication techniques. Currently, two commonly fabricated image sensors are CMOS image sensors and charge coupled device (CCD) image sensors. Each generally includes an array of pixels containing the photo sensors. The image sensors typically use photo sensors in the form of photogates, phototransistors or photodiodes.

When an image is focused on the imager array, light corresponding to the image is directed to the pixels, including the photo sensors. It is known in the art to use an imager array of pixels having a micro-lens array that includes a convex micro-lens for each pixel. Each micro-lens may be used to direct incoming light through a circuitry region of the corresponding pixel to the photo sensor region, thereby increasing the amount of light reaching the photo sensor and thereby increasing the fill factor of the pixels. Each photo sensor is located at a suitable depth in the image sensor such that light, when collimated and focused by a corresponding micro-lens of a given focal length, is directed onto the photo sensor. Examples of other uses of micro-lens arrays include intensifying illuminating light from pixels of a non-luminescent display device (such as a liquid crystal display device) to increase the brightness of the display, forming an image to be printed in a liquid crystal or light emitting diode printer, and providing focusing for coupling a luminescent device or a receptive device to an optical fiber.

Typically, each pixel in the imager array produces a signal corresponding to the intensity of light impinging on the photo sensor associated with that pixel. The magnitude of the signal produced is approximately proportional to the amount of light impinging on the photo sensor. The signals may be used, for example, to display a corresponding image on a monitor or to otherwise provide information about the optical image.

As semiconductor devices and the corresponding image sensors are made smaller, the micro-lens arrays must be made smaller as well. As each micro-lens is made smaller, the focal length of the micro-lens is reduced. This reduced focal length causes light to be focused at a reduced depth in the image sensor device. Typically, in prior art devices, the depth of the photo sensors is reduced in the substrate to correspond to the reduced focal length of the micro-lenses. Decreasing the photo sensor's depth in the substrate, however, requires manufacturing changes, and results in additional effort, expense and time in processing.

Known fabrication methods for micro-lenses use patterning and reflow techniques that are typically used to produce convex micro-lenses. These fabrication techniques are difficult to tailor to produce micro-lenses that direct light to a particular focal point when the micro-lens size and geometry (and resultant focal length) change.

Additionally, in known image sensors, a large amount of light incident on the image sensor device is not directed to the photo sensor due to the geometry of the micro-lens array. In particular, light incident on the space between individual micro-lenses (the lens-lens space) remains uncaptured by the micro-lens, and never impacts the photo sensor. It is difficult to produce image sensor micro-lenses with improved light capture using known patterning and micro-lens reflow processes.

Further, in known image sensors, a passivation layer such as a silicon nitride passivation layer separates the color filters from the photo sensors. This passivation layer causes undesirable reflection in the optical path to the photo sensors.

Accordingly, there is a desire and need for an image sensor having micro-lenses formed to focus light onto the photo sensors of the image sensor such that the depth of the photo sensors does not have to be decreased even when the image sensor device, including its photo sensors and micro-lenses, decreases in size.

There is also a need for an improved method of fabricating an image sensor micro-lens of desired geometry and focal length. Furthermore, there is a need for an image sensor including micro-lenses having improved light capture. Moreover, there is a need for an image sensor and method having reduced reflection in the current stack of the image sensor.

SUMMARY OF THE INVENTION

The present invention provides micro-lenses formed to focus light onto the photo sensors of the image sensor such that the depth of the photo sensors does not have to be decreased even when the image sensor device, including its photo sensors and micro-lenses, decrease in size.

In one embodiment, an image sensor includes a first micro-lens array of one or more first micro-lenses for collimating (i.e., capturing) incoming light and a second micro-lens array of one or more second micro-lenses for focusing the light onto a photo sensor. The second micro-lens array is separated from the first micro-lens array by a cavity. The second micro-lens array and first micro-lens array are positioned relative to one another such that incoming light is collimated (i.e., captured) by a first micro-lens of the first micro-lens array, and then directed through the cavity to a second micro-lens of the second micro-lens array, which focuses the incoming light onto a corresponding photo sensor. In a preferred embodiment, the cavity that separates the second micro-lens array from the first micro-lens array consists of an air gap.

In another embodiment of the present invention, an image sensor includes a first micro-lens array of one or more first micro-lenses for colliminating (i.e., capturing) and focusing incoming light onto a photo sensor. The first micro-lens array is separated from the upper-most layers of the semiconductor substrate by a cavity.

Various embodiments of the image sensor may further include supports in the form of posts, or in the form of other structures such as walls, to support the upper layers of the image sensor, including the image sensor layers above the cavity, relative to the lower layers of the image sensor. The supports may be located at any suitable location in the image sensor such as at the edges of the image sensor or at locations interior of the edges of the image sensor.

In one embodiment of a fabrication method of the invention, a first of at least two arrays of micro-lenses maybe formed by coating a semiconductor substrate with a layer of second micro-lens material and a lower photo resist. Lower layer openings are developed in the photo resist. The second micro-lens material is then etched to form a second micro-lens array. A sacrificial material is applied to the second micro-lens array. Lens molds and one or more support molds are formed in the sacrificial material. Supports are formed by filling the support molds with a support material that is at least substantially non-reflective and that is of sufficient strength to support the upper layers of the image sensor. The first micro-lens array is formed by applying a layer of first micro-lens material to the sacrificial material to fill the lens molds formed in the sacrificial material. The sacrificial material is removed from the image sensor by a suitable method (such as by heating or chemical removal) leaving a cavity between the second micro-lens array and the first micro-lens array.

In a desired embodiment, the sacrificial material is degraded by heat or chemical treatment, and, as it degrades, the sacrificial material diffuses through the micro-lens material.

In an alternative embodiment, additional clean techniques are applied to remove residual particles through vacuum channels formed in the image sensor. The sacrificial material may be removed, such as through heat or chemical treatment. Residual sacrificial material remaining after such treatment may be removed by vacuuming through the vacuum channels. The vacuum channels may also be used to vacuum remove other residual particles, such as residual chemicals that may remain after a chemical removal treatment.

A color filter array may be applied to the first-most micro-lens material of the present invention. For example, a color filter may be applied on top of the first micro-lens array. Additional coatings, for example protective coatings, may also be applied on top of the color filter array. The color filter may also be applied at alternative locations, for example below the second micro-lens array (i.e., the color filter array may be applied to the upper layers of the substrate before applying the second micro-lens material).

In another embodiment of a fabrication method of the invention, an image sensor is provided having a first micro-lens array for collimating and focusing incoming light onto a photo sensor. The first micro-lens of the array may be formed by coating a semiconductor substrate with a layer of sacrificial material. Lens molds and support molds are formed in the sacrificial material. Supports are formed by filling the support molds with a support material that is at least substantially non-reflective and sufficiently strong enough to support the upper layers of the image sensor. A layer of first micro-lens material is applied to the sacrificial material to fill the lens molds and form the first micro-lens array. It is desired that the supports be made of the first micro-lens material and be formed at the same time as the first micro-lens array by applying the first micro-lens material. The sacrificial material may be removed by heating or chemical treatment. If necessary, one or more vacuum channels may be formed in the image sensor through which residual particles (e.g., sacrificial material or residual chemical solvents) may be removed.

The use of a sacrificial material in the present invention allows fabrication of micro-lenses of a desired focal length such that light may be directed to corresponding photo sensors at a desired depth in a semiconductor substrate.

The geometry of the micro-lenses fabricated using the sacrificial material lens molds can be formed to a variety of shapes. Preferably, the micro-lenses formed according to the invention have a concave shape. Concave micro-lenses may provide improved light capture, such as for example where the edges of the micro-lenses of a given micro-lens array touch or overlap in the surface plane of the array.

Further, the image sensor may be constructed without a passivation layer between the color filter array and the photo sensors where the cavity of the image sensor is positioned between the color filter array the photo sensors (such as where the color filter array is formed above the cavity).

BRIEF DESCRIPTION OF THE DRAWINGS

These and other features and advantages of the invention will be more clearly understood from the following detailed description which is provided in connection with the accompanying drawings, in which.

DETAILED DESCRIPTION OF THE INVENTION

In the following detailed description, reference is made to the accompanying drawings which form a part hereof, and which illustrate specific embodiments of the present invention. These embodiments are described in sufficient detail to enable those of ordinary skill in the art to make and use the invention. It is also understood that structural, logical, or procedural changes may be made to the specific embodiments disclosed without departing from the spirit and scope of the present invention.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photo-conversion device or photo sensor and transistors for processing an electrical signal from electromagnetic radiation sensed by the photo-conversion device. It should be understood that the invention may be used with any pixel configuration such as e.g., three transistor (3T), four transistor (4T), five transistor (5T), etc., configuration. Although the invention is described herein with reference to the architecture of a defined number of pixels, such as one pixel or three pixels, it should be understood that this is representative of a plurality of pixels in an array of an imager device. In addition, although the invention is described below with reference to a CMOS imager, the invention has applicability to any solid state imaging device having pixels. The following detailed description is, therefore, not to be taken in a limiting sense, and the scope of the present invention is defined only by the appended claims.

Figure 1:
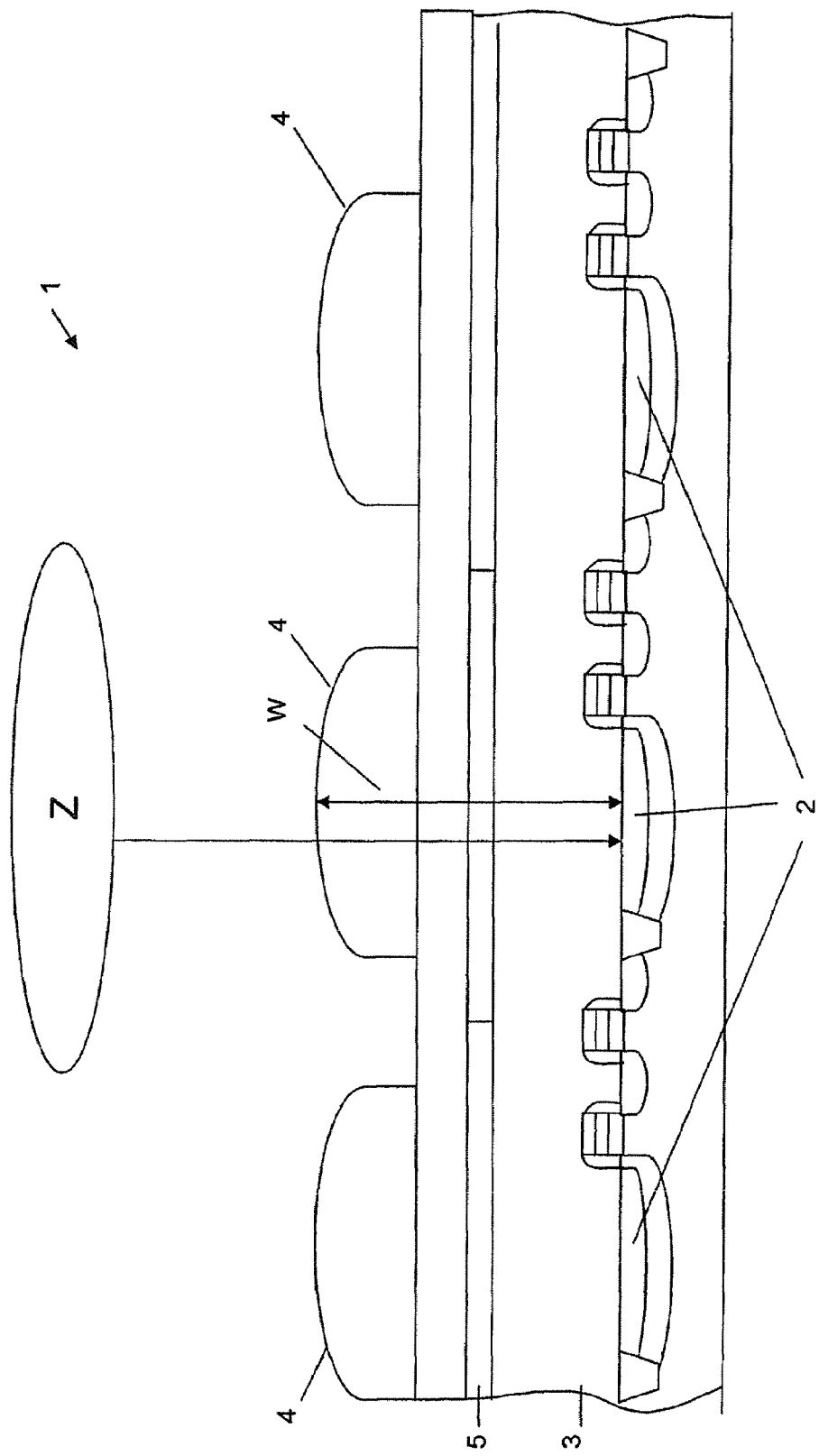
FIG. 1 is an enlarged cross-sectional view of a conventional image sensor including photo sensors, color filters and multiple micro-lenses formed thereon.

Referring to FIG. 1, a prior art image sensor 1 is shown having photo sensors 2 located in a semiconductor substrate 3. Micro-lenses 4 are formed on the semiconductor substrate 3. The image sensor 1 also includes a color filter array 5. The focal length for the micro-lenses 4 is shown as W. The photo sensors 2 are located at a depth in the semiconductor substrate 3 such that incoming light Z is focused by micro-lenses 4 onto the photo sensors 2.

Figure 2:
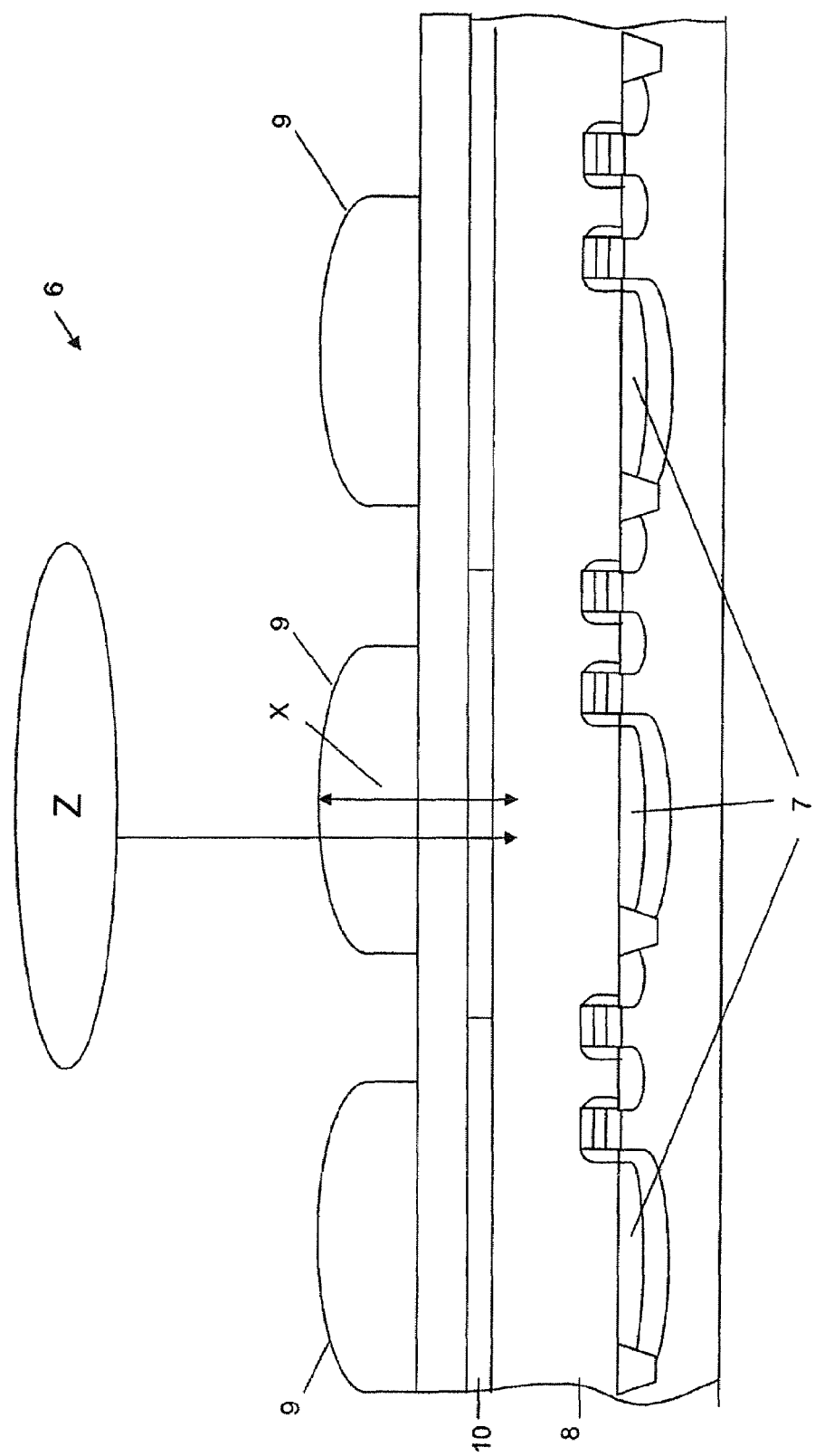
FIG. 2 is an enlarged cross-sectional view of the conventional image sensor of FIG. 1, reduced in size including photo sensors, color filters and micro-lenses of reduced size.

FIG. 2 shows an image sensor 6 which is the image sensor 1 of FIG. 1 fabricated to a reduced size. Photo sensors 7 (shown embedded in semiconductor substrate 8), micro-lenses 9, color filter array 10, and focal length X illustrated in FIG. 2, are each reduced in size relative to the photo sensors 2, micro-lens 4, color filter array 5, and focal length W shown in FIG. 1. The photo sensors 7 shown in FIG. 2, however, are at the same depth in the semiconductor substrate 8 as the photo sensors 2 of FIG. 1. As shown in FIG. 2, the reduced focal length X, caused by the reduced size of the micro-lens 9, stops above the photo sensors 7. Thus, incoming light Z is not focused onto the photo sensors 7, which is undesirable.

Figure 3:
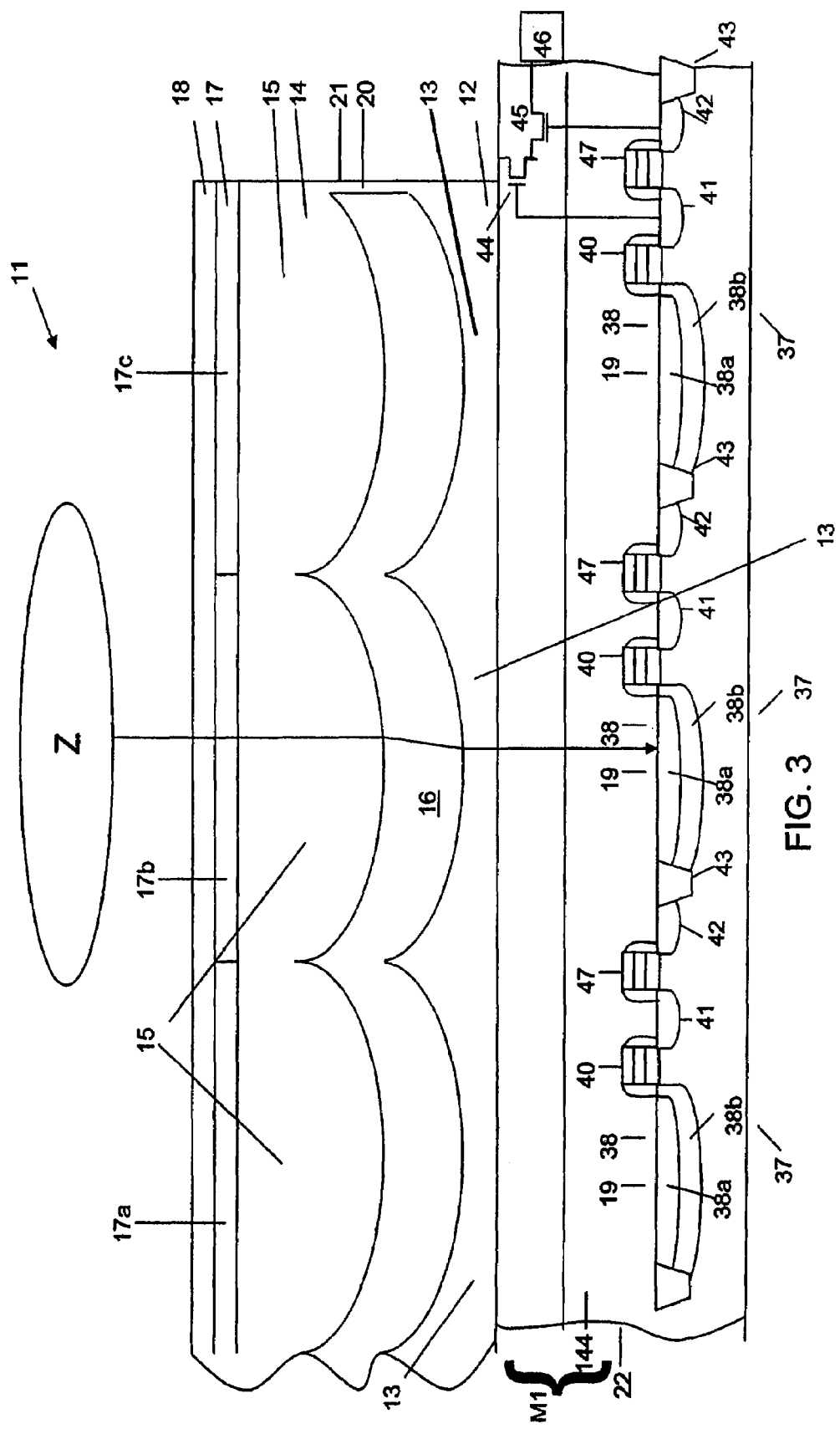
FIG. 3 is an enlarged cross-sectional view, in accordance with an exemplary embodiment of the invention, of an image sensor including photo sensors, color filters and multiple micro-lens arrays formed thereon.

FIG. 3 shows an embodiment of an image sensor 11 according to a first exemplary embodiment of the invention. The illustrated image sensor 11 includes a first micro-lens array 14 comprised of one or more first micro-lenses 15 and a second micro-lens array 12 comprised of one or more second micro-lenses 13. The second micro-lens array 12 and first micro-lens array 14 are separated by a cavity 16. Preferably, the cavity 16 is comprised of an air gap. In operation, incoming light Z is captured by the first micro-lenses 15 of first micro-lens array 14, and directed through the cavity 16 to the second micro-lenses 13 of the second micro-lens array 12.

The illustrated imaging device 11 further includes pixel cells 37 located in substrate 22. The illustrated pixel cells 37 comprise photo sensors 19. In FIG. 3, photo sensors 19 are shown in the form of a photodiode 38. It should be appreciated, however, that the photodiode 38 may be any photosensitive region including a photogate or the like, and the invention is not limited to the illustrated pixel cell 37. The pixel cells 37 are illustrated as a four-transistor (4T) pixel cell. It should be noted that this illustration is not intended to limit the invention to a particular pixel cell configuration. That is, the pixel cell may contain, for example, three, four, five, or more transistors.

Each illustrated pixel cell 37 contains a photodiode 38 comprised of a doped region 38a (typically a p-type region) formed within another doped region 38b (typically an n-type region). It is known in the art that, in operation, a control signal (not shown) may be applied to the photodiode 38 so that when incoming light Z in the form of photons strikes the photodiode 38, the photo-generated electrons accumulate in a doped source region under the photodiode 38. A transfer gate 40 is located next to the photodiode 38, and has a floating diffusion region 41 and a source/drain region 42. A field oxide layer 43 around the pixel cell 37 serves to isolate it from other pixel cells 37 in the array 36.

The transfer gate 40 is controlled by a transfer signal. The source/drain region 42 passes charges received from the photodiode 38 to an output transistor 44, a row select transistor 45 and then to readout circuitry 46. A reset transistor 47 operates to reset the floating diffusion region 41 to a predetermined initial voltage just prior to signal readout. It should be noted that each pixel cell 37 contains an output transistor 44 and row select transistor 45 that are also electrically connected to the readout circuitry 46, but are omitted from FIG. 3 for the sake of clarity (the output transistor 44, row select transistor 45, and readout circuitry 46 are also omitted from subsequent drawings for the sake of clarity of the drawings).

The image sensor 11 may include additional layers. For example, additional processing methods may be used to form insulating, shielding, and metallization layers to connect gate lines and other connections to the pixel sensor cells. Also, an additional passiviation layer can be formed underneath the metallization layers. The passivation layer could be formed of, for example, silicon nitride, silicon dioxide, borosilicate glass (BSG), phosphosilicate glass (PSG), or boro-phosphosilicate glass (BPSG), which is CMP planarized and etched to provide contact holes. These contact holes are then metallized to provide contacts. Generally, a passivation layer is positioned between the color filter array 17 and photo sensors 19, This passivation layer is not required, however, if the cavity 16 according to the present invention is positioned between the photo sensors 19 and the color filter array 17.

Conventional layers of conductors and insulators may also be used to interconnect the structures and to connect the pixels to peripheral circuitry. For the sake of clarity, the upper-most layers of the substrate 22 (including for example any insulating, shielding, metallization layers, and passiviation layer) will collectively be referred to as an M1 layer of the semiconductor substrate 22.

In operation, incoming light Z is collimated by a first micro-lens 15 of first micro-lens array 14 and directed through cavity 16 to a corresponding second micro-lens 13. The second micro-lens 13 focuses incoming light Z onto a corresponding photo sensor 19. Although FIG. 3 and subsequent figures depict the incoming light Z as being generally perpendicular to the semiconductor substrate 22, it may actually be incident at other angles and yet focused onto photo sensor 19. Prior to penetrating the first micro-lens array 14, the incoming light Z is preferably filtered through a color filter array 17 positioned above the first micro-lens array 14, as shown in FIG. 3. The color filter array 17 is comprised of three colored filters (e.g., 17a, 17b, 17c). Typical color filters 17a, 17b, 17c include red, green, and blue filters (RGB), or cyan, magenta, and yellow (CMY) filters. It should be noted that the color filters 17a, 17b, 17c could also be a fluorescent material film or other device for converting the wavelength of incident light. Each color filter 17a, 17b, 17c, is respectively associated with a corresponding first micro-lens 15 of first micro-lens array 14. It is desirable to form the color filters 17a, 17b, 17c on top of first micro-lens array 14.

As shown in FIG. 3, image sensor 11 may further include a protective layer 18 formed on top of the color filter array 17 as the uppermost layer of the image sensor 11. Preferably, the protective layer 18 is comprised of an oxide layer, such as $SiO_2$, of thickness sufficient to protect the image sensor from damage (for example, during packaging). In addition, layer 18 may be an antireflection coating (an "ARC").

Although the color filter array 17 is shown in FIG. 3 as positioned above the first micro-lens array 14, the color filter array 17 may instead be located at other areas in the image sensor 11, such as for example between the M1 layer of the substrate 22 and the second micro-lens array 12. If the color filter array 17 is located at a position below the first micro-lens array 14, then the first micro-lens array 14 may be the uppermost layer of the image sensor 11.

The second micro-lenses 13 and first micro-lenses 15 may be comprised of any suitable micro-lens material. Examples of known micro-lens materials include silicon dioxide ($SiO_2$), silicon nitride, plasma enhanced chemical vapor disposition (PECVD) oxides (such as for example silicon oxides), inter-layer dielectric materials, and BoroPhosphoSilicate Glass (BPSG), all of which are suitable for transmitting light. It is desired that the second micro-lenses 13 and first micro-lenses 15 are between 0.5 and 1.5 microns at their thickest points and, in the surface plane, are about 2.0 to 5.2 microns in diameter.

Figure 3A:
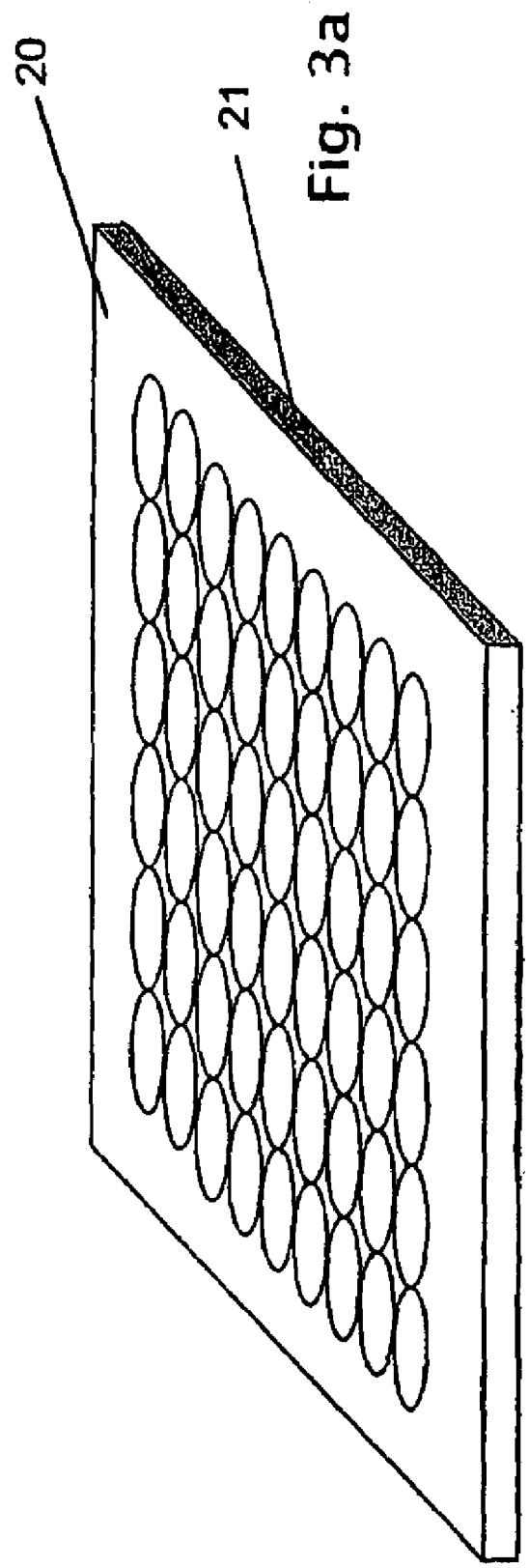
FIG. 3a is plan view of an exemplary embodiment of the image sensor device of the invention having support walls.

Image sensor 11 further includes one or more supports 20. The supports 20 are located at one or more designated areas capable of supporting the upper layers of the image sensor 11 (including the first micro-lens array 14) relative to the second micro-lens array 12. The supports 20 are preferably comprised of the same material as the first micro-lens array 14, but alternatively can be comprised of a different material that is at least substantially non-reflective and that is sufficiently strong enough to support the upper layers of the image sensor 11. For example where $SiO_2$ is the first micro-lens material, a suitable material for the supports 20 (other than the first micro-lens material) is, for example, silicon nitride. Preferably, the supports 20 are in the form of posts, as shown in FIG. 3, but may also be of other configurations such as, for example in the form of support walls (best shown in FIG. 3a). In addition, the single image sensor 11 may use supports 20 of different forms, for example the image sensor 11 may use both posts and support walls. In FIG. 3, supports 20 are in the form of posts and are located at the edges 21 of the image sensor 11.

Figure 3B:
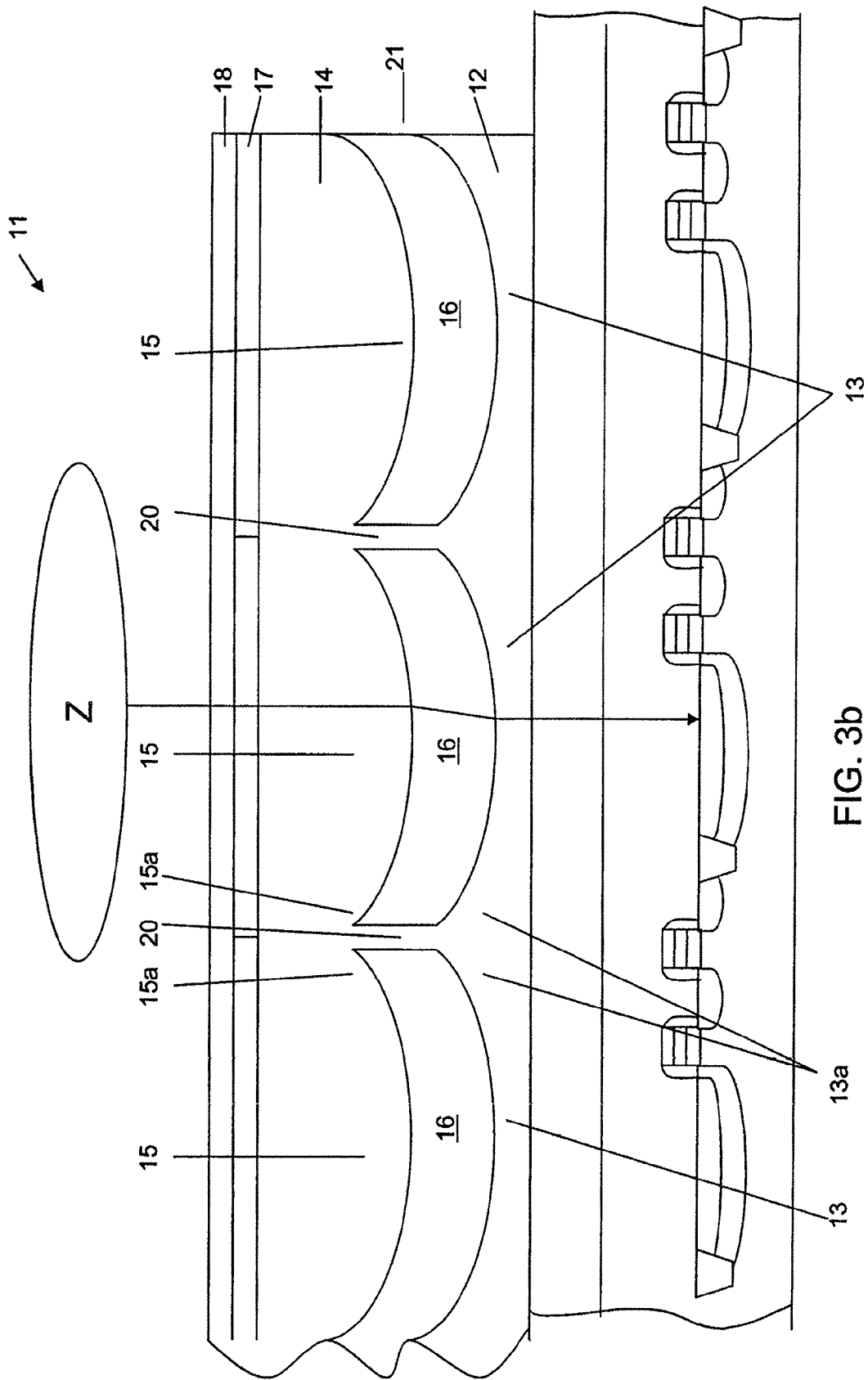
FIG. 3b is an enlarged cross-sectional view of an exemplary embodiment of the image sensor device of the invention having supports located internal of the edges of the image sensor.

FIG. 3b illustrates an alternative embodiment in which posts are located internally of edges 21. In FIG. 3b, the supports 20 are positioned within cavity 16 between the second micro-lens array 12 and the first micro-lens array 14 at locations at least substantially outside of the area within cavity 16 through which light is directed from the first micro-lenses 15 to the second micro-lenses 13. For example, referring to FIG. 3b, first outer edges 15a of first micro-lens 15 and second outer edges 13a of second micro-lens 13 are usually not used for collimating and focusing light Z. The supports 20 may, for example, be positioned between first outer edges 15a and second outer edges 13a as shown in FIG. 3b.

Figure 4:
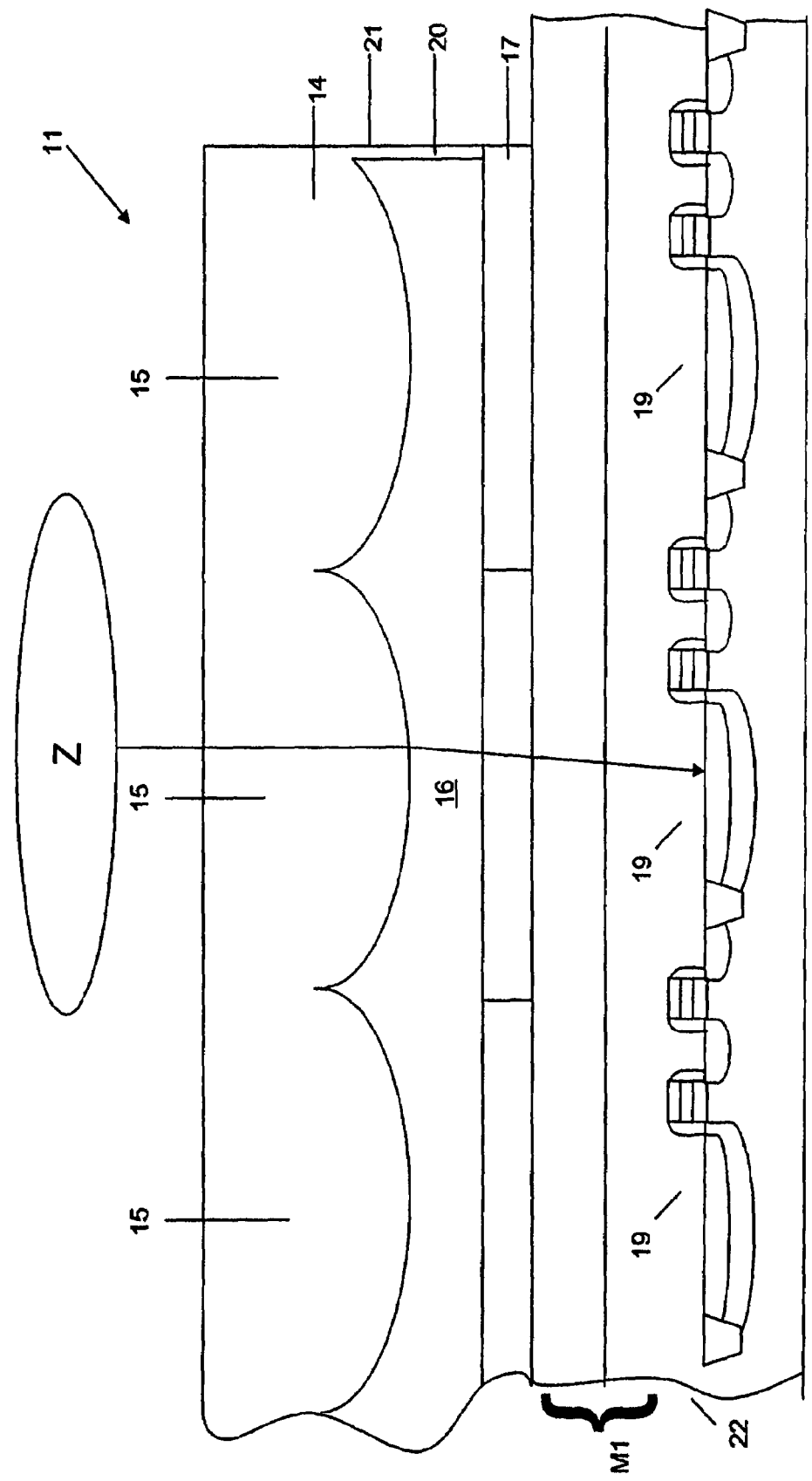
FIG. 4 is an enlarged cross-sectional view, in accordance with an exemplary embodiment of the invention, of an image sensor including photo sensors, color filters and a single micro-lens array formed thereon.

FIG. 4 illustrates another exemplary embodiment of the invention in which the image sensor of FIG. 3 is varied to include a single micro-lens array, in the form of a first micro-lens array 14. In this illustrated embodiment, the first micro-lens array 14 both collimates the incoming light and focuses it onto the photo sensors 19. Referring to FIG. 4, a color filter array 17 is located on top of the upper layers, i.e., the M1 layer, of the substrate 22. The first micro-lens array 14 is positioned over the color filter array 17. A cavity 16 separates the first micro-lens array 14 from the color filter array 17. One or more supports 20 are located at the edges 21 and support the upper layers of image sensor 11, including the first micro-lens array 14, relative to the color filter array 17 and the M1 layer. The supports 20 may alternatively be located at other positions at least substantially outside the area within cavity 16 through which light Z is directed to the lower layers of the image sensor 11 (e.g., to color filter array 17). The supports 20 may be formed of a material that is at least substantially non-reflective and sufficiently strong to support the upper layers of image sensor 11. Preferably, both the supports 20 and the micro-lens array 14 are comprised of $SiO_2$.

Figure 5A:
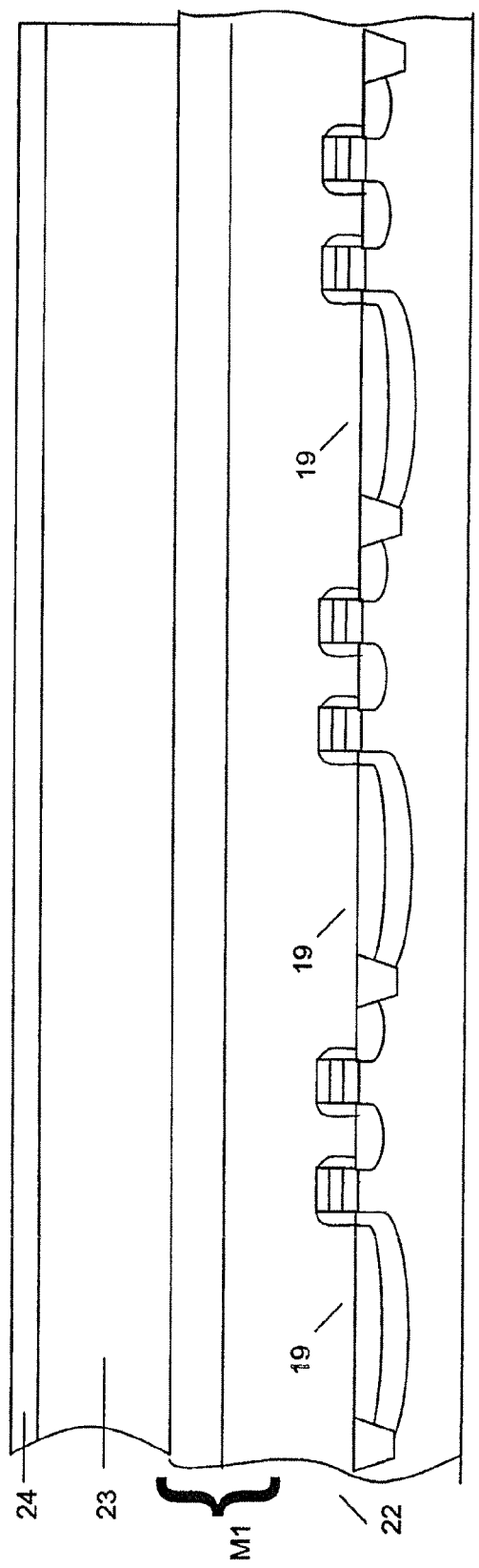
FIG. 5a is an enlarged cross-sectional view of the embodiment of the image sensor of FIG. 3 during fabrication, having a second micro-lens material applied.

The manner of fabricating the image sensor illustrated in FIG. 3, is now described with reference to FIGS. 5a through 5i. Referring to FIG. 5a, a semiconductor substrate 22 having upper layers (the M1 layer) and photo sensors 19 is provided. The M1 layer is coated with a second micro-lens material 23, such as for example with $SiO_2$. The second micro-lens material 23 is preferably applied using plasma enhanced chemical vapor disposition techniques known in the art for applying oxides (preferably silicon oxides). The second micro-lens material 23 may also be applied by other conventional micro-lens application methods such as by spin coating the second micro-lens material onto the M1 layer, followed by soft-bake techniques. A suitable soft-bake technique known in the art is to heat the micro-lens material at approximately 100 degrees Celsius for approximately 1.5 minutes. A lower photo resist 24 is applied on top of the second micro-lens material 23. The lower photo resist 24 may be applied by conventional methods such as spin coating.

It is known in the art that semiconductor substrates may include an M1 layer having an uppermost layer comprised of a suitable micro-lens material, such as for example an $SiO_2$ layer formed as an interlayer dielectric in the semiconductor substrate. In the illustrated embodiment, if the semiconductor substrate 22 were formed in such manner, the step of applying a second micro-lens material 23 is not required in order to fabricate the image sensor 11 embodied in FIG. 3.

Figure 5B:
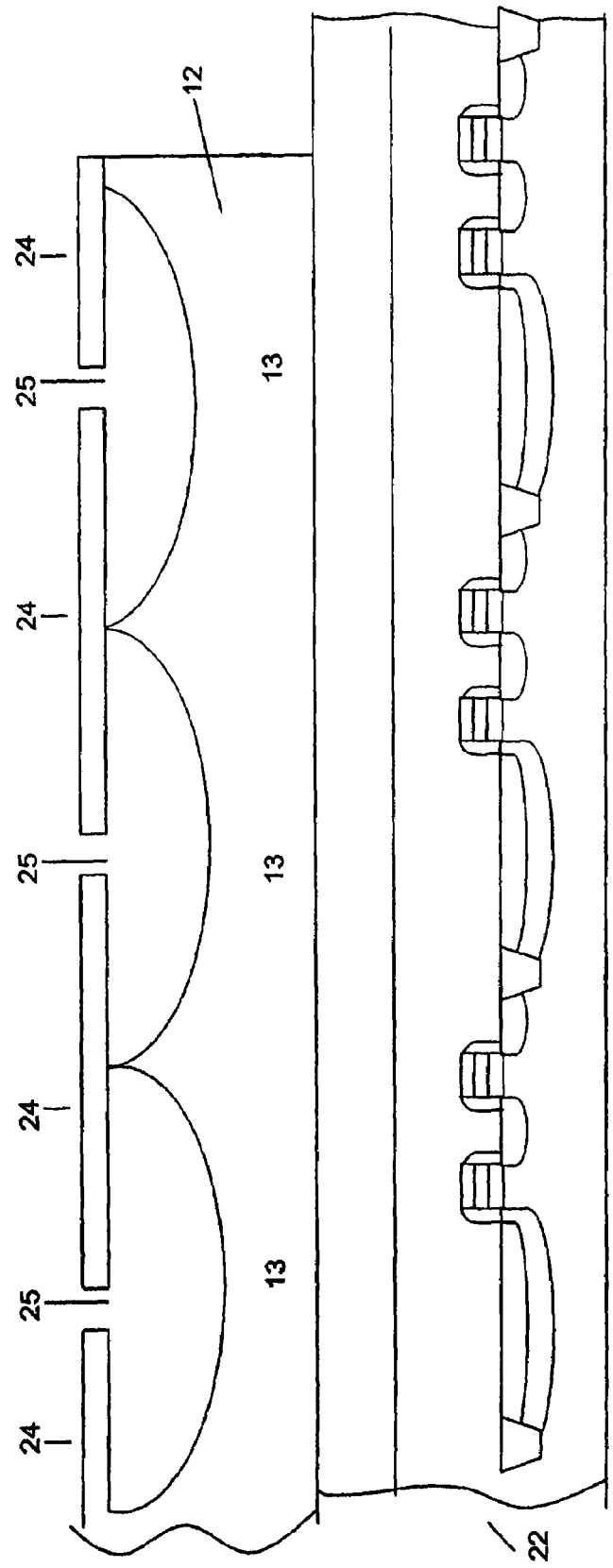
FIG. 5b is an enlarged cross-sectional view of the embodiment of the image sensor of FIG. 3 during fabrication, having second micro-lenses formed therein.

Referring to FIG. 5b, the lower photo resist 24 is exposed and areas of the lower photo resist 24 are developed away to form lower layer openings 25. The lower photo resist 24 may be exposed by conventional methods such as by masking and then chemically developing away desired areas of the photo resist, leaving lower layer openings 25.

As also shown in FIG. 5b, the second micro-lens array 12 including one or more second micro-lenses 13 is formed in the second micro-lens material 23 (FIG. 5a). Preferably, the second micro-lens array 12 is formed by etching second micro-lenses 13 using known etching methods, such as by applying a chemical etching solution followed by a rinse to stop the etching process. Etching the second micro-lens material 23 forms the second micro-lens array 12 comprised of concave micro-lenses 13. Preferably, the chemical etching solution is an isotropic etch solution (i.e., a solution that etches the second micro-lens material 23 at the same rate in all directions). An isotropic chemical etch forms a concave lens of hemispherical shape.

Figure 5C:
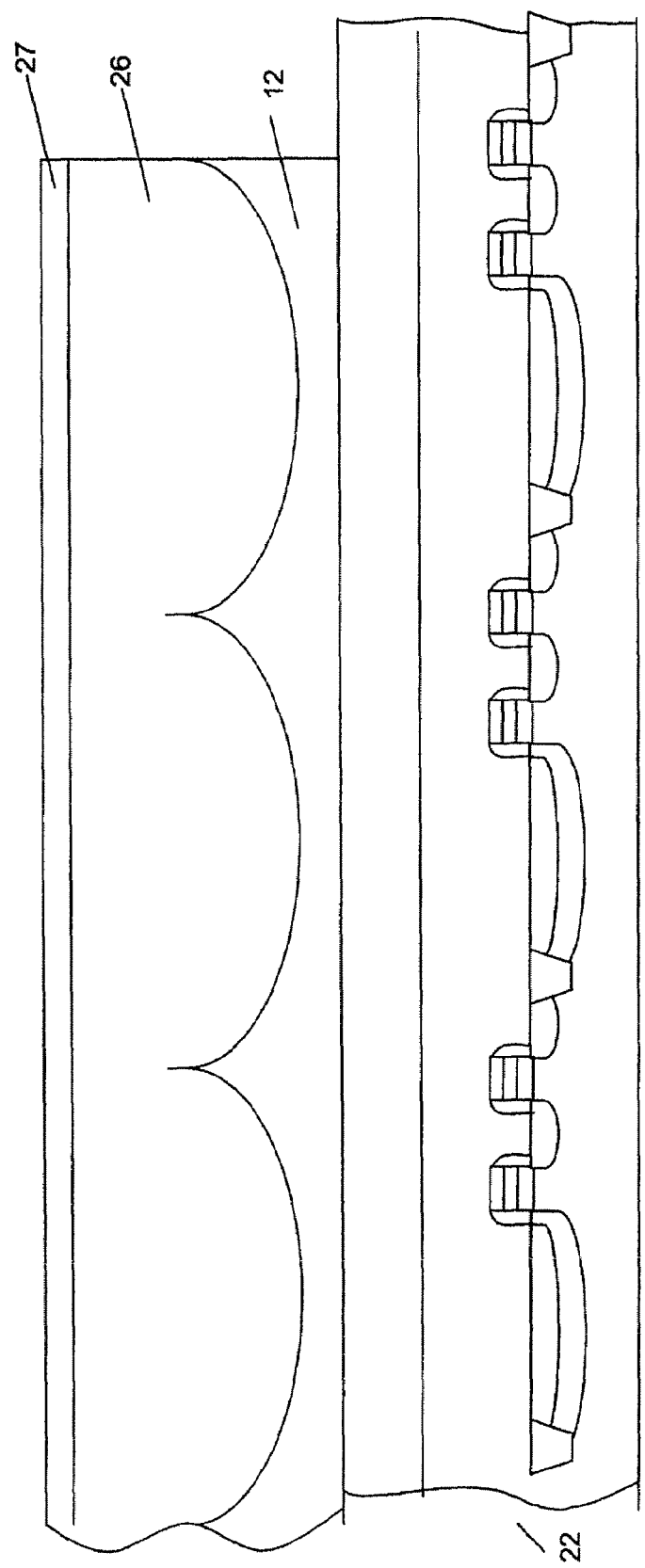
FIG. 5c is an enlarged cross-sectional view of the embodiment of the image sensor of FIG. 3 during fabrication, having a sacrificial material applied.

Referring to FIG. 5c, the second micro-lens array 12 is coated with a suitable sacrificial material 26. Examples of suitable sacrificial materials include materials that can be suitably etched and removed from the image sensor, such as for example photosensitive polycarbonates. The sacrificial material 26 may be applied by conventional application methods such as by spin coating the sacrificial material onto the second micro-lens array 12. A sacrificial photo resist 27 is applied on top of the sacrificial material 26. The sacrificial photo resist 27 may also be applied by conventional methods such as spin coating.

Figure 5D:
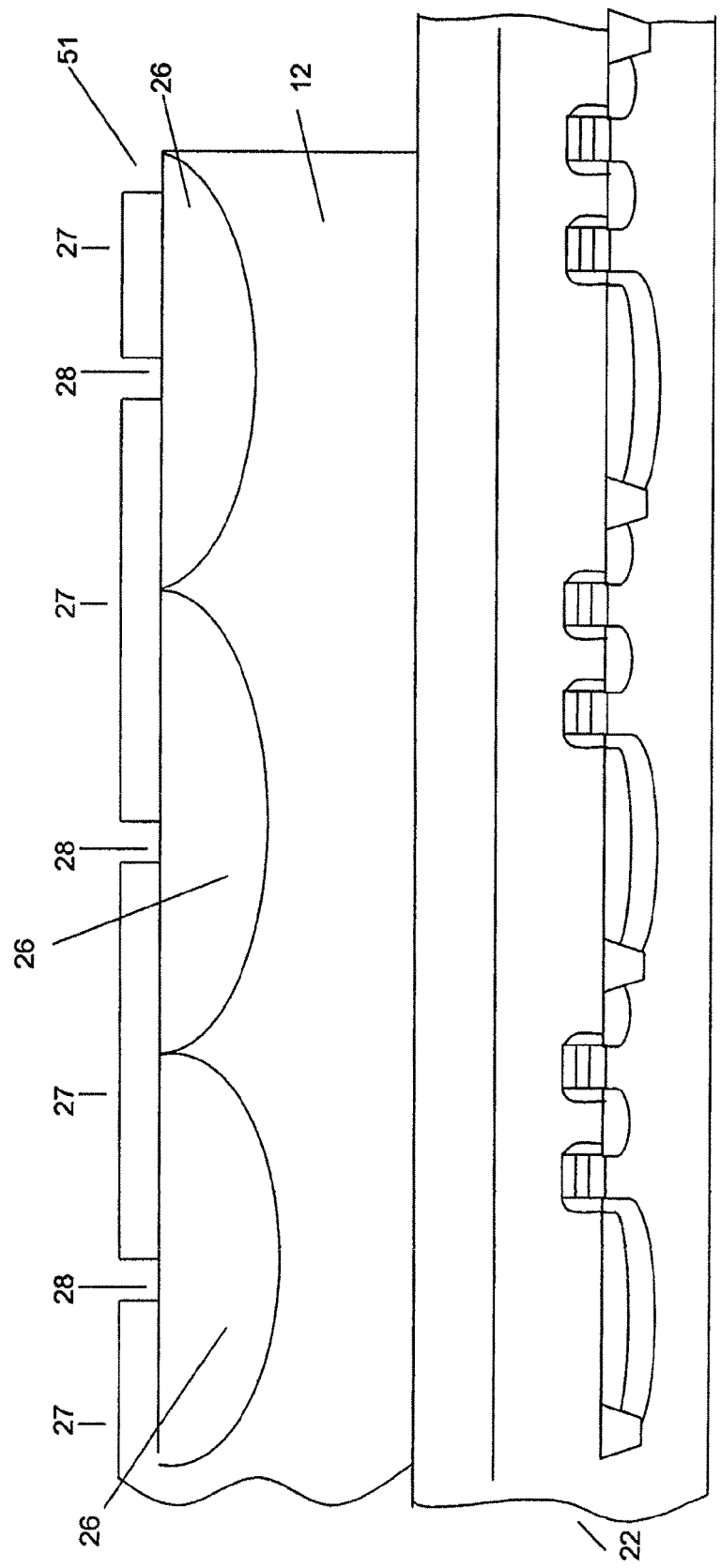
FIG. 5d is an enlarged cross-sectional view of the embodiment of the image sensor of FIG. 3 during fabrication, having a support openings and sacrificial resist openings formed therein.

Referring to FIG. 5d, the sacrificial photo resist 27 is exposed and areas of the sacrificial photo resist 27 are developed away to form sacrificial resist openings 28. The sacrificial photo resist 27 may be exposed by conventional methods such as by masking and developing away desired areas of the photo resist 27, to leave the sacrificial resist openings 28.

As also illustrated in FIG. 5d, one or more support openings 51 is formed in the sacrificial photo resist 27. The sacrificial photo resist 27 may be exposed by conventional methods such as by masking and developing away desired areas of the photo resist, leaving support openings 51. Preferably, support openings 51 are formed in conjunction with the step of forming the sacrificial resist openings 28.

Figure 5E:
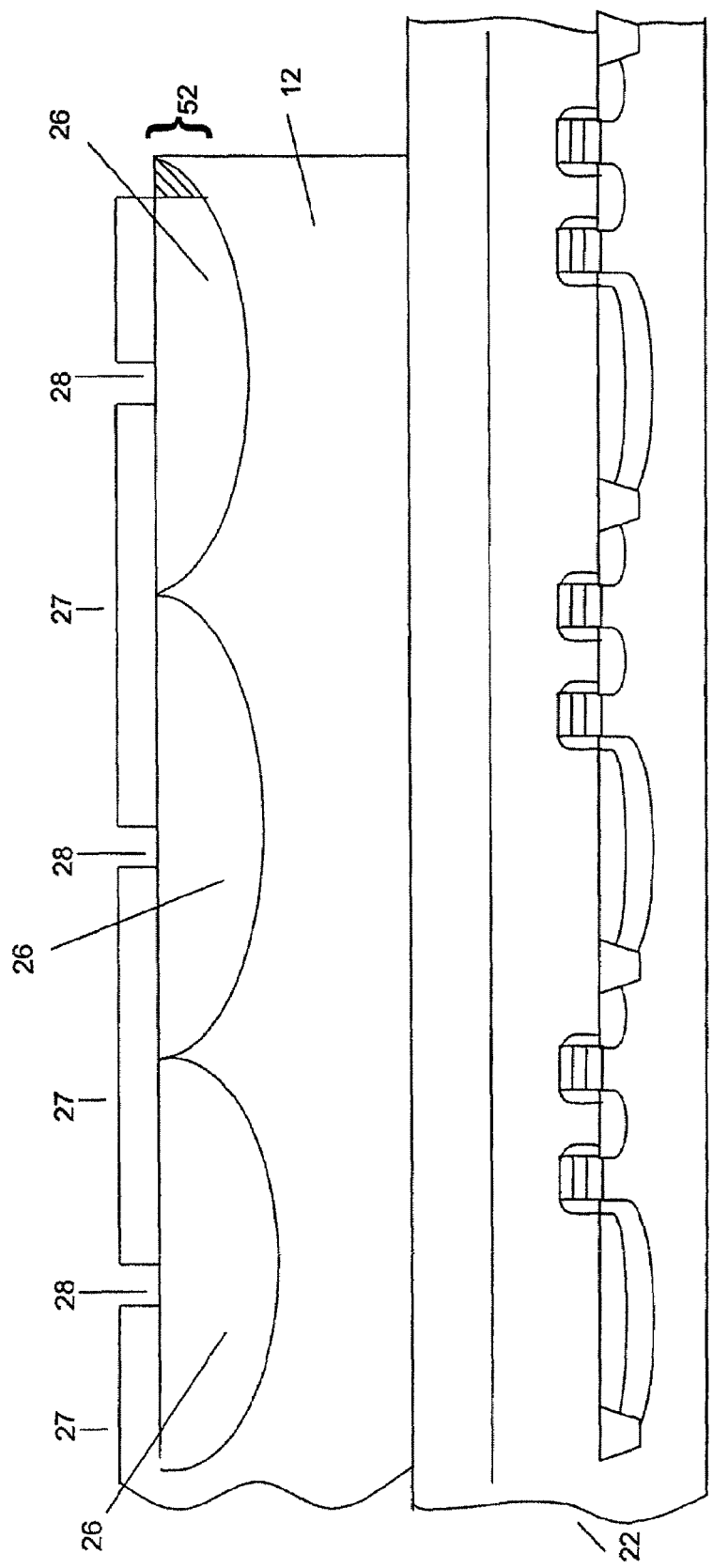
FIG. 5e is an enlarged cross-sectional view of the embodiment of the image sensor of FIG. 3 during fabrication, having support molds formed therein.

As shown in FIG. 5e, the support molds 52 are formed in the sacrificial material 26 and may be etched by conventional methods, such as by applying a chemical etching solution followed by a rinse. Preferably, an anisotropic chemical etch is used to etch columnar support molds 52, that correspond to the width and length of the support openings 51 in the surface plane, and that are etched through the sacrificial material 26 to the second micro-lens array 12.

Figure 5F:
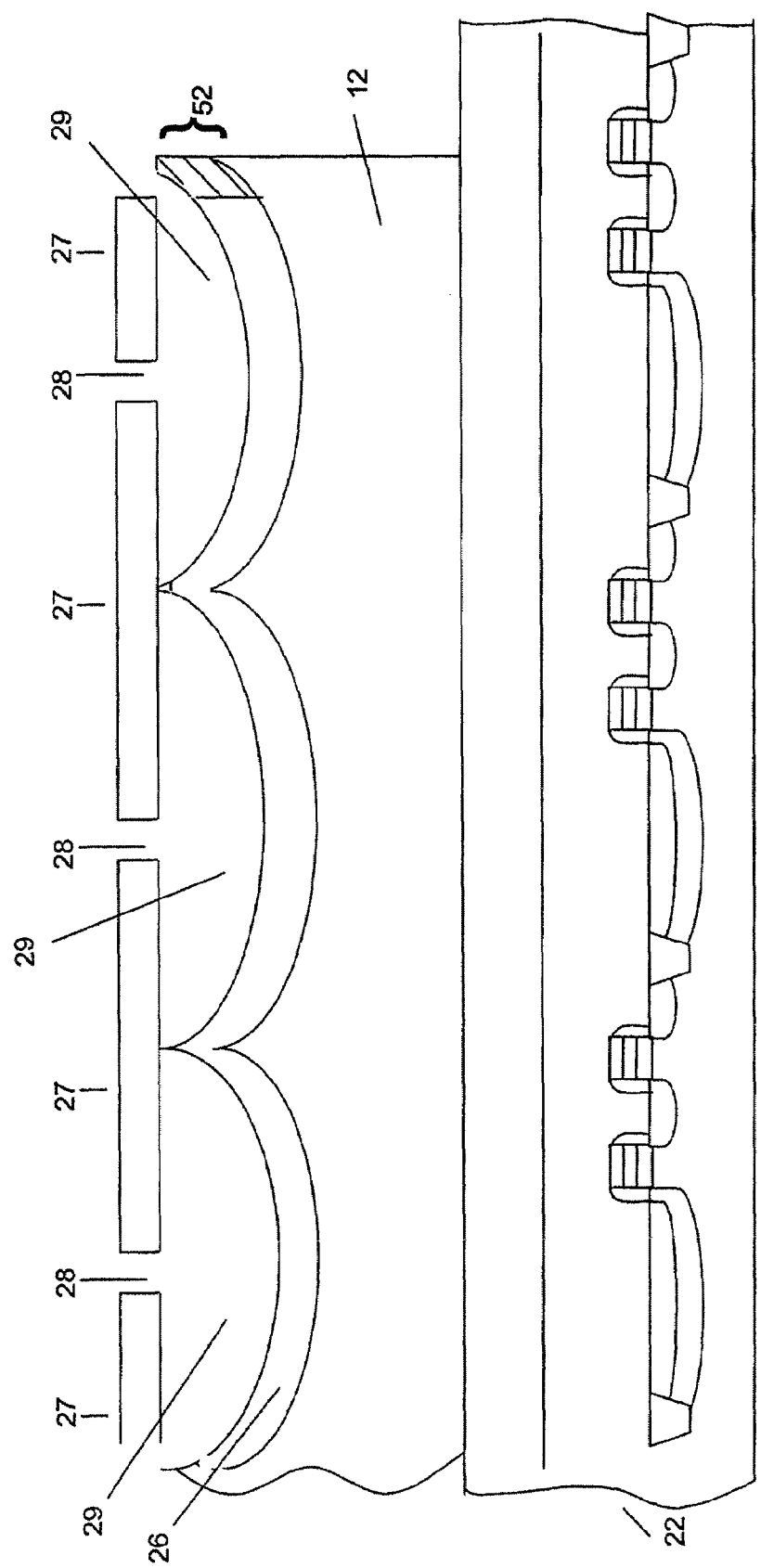
FIG. 5f is an enlarged cross-sectional view of the embodiment of the image sensor of FIG. 3 during fabrication, having lens molds formed therein.

As illustrated in FIG. 5f, lens molds 29 are also formed in the sacrificial material 26. In a preferred embodiment of the invention, the lens molds 29 may be etched by applying a chemical etching solution followed by a rinse to stop the etching process. Preferably, the chemical etching solution is an isotropic etch solution. An isotropic chemical etch forms a concave lens mold 29 of hemispherical shape.

Figure 5G:
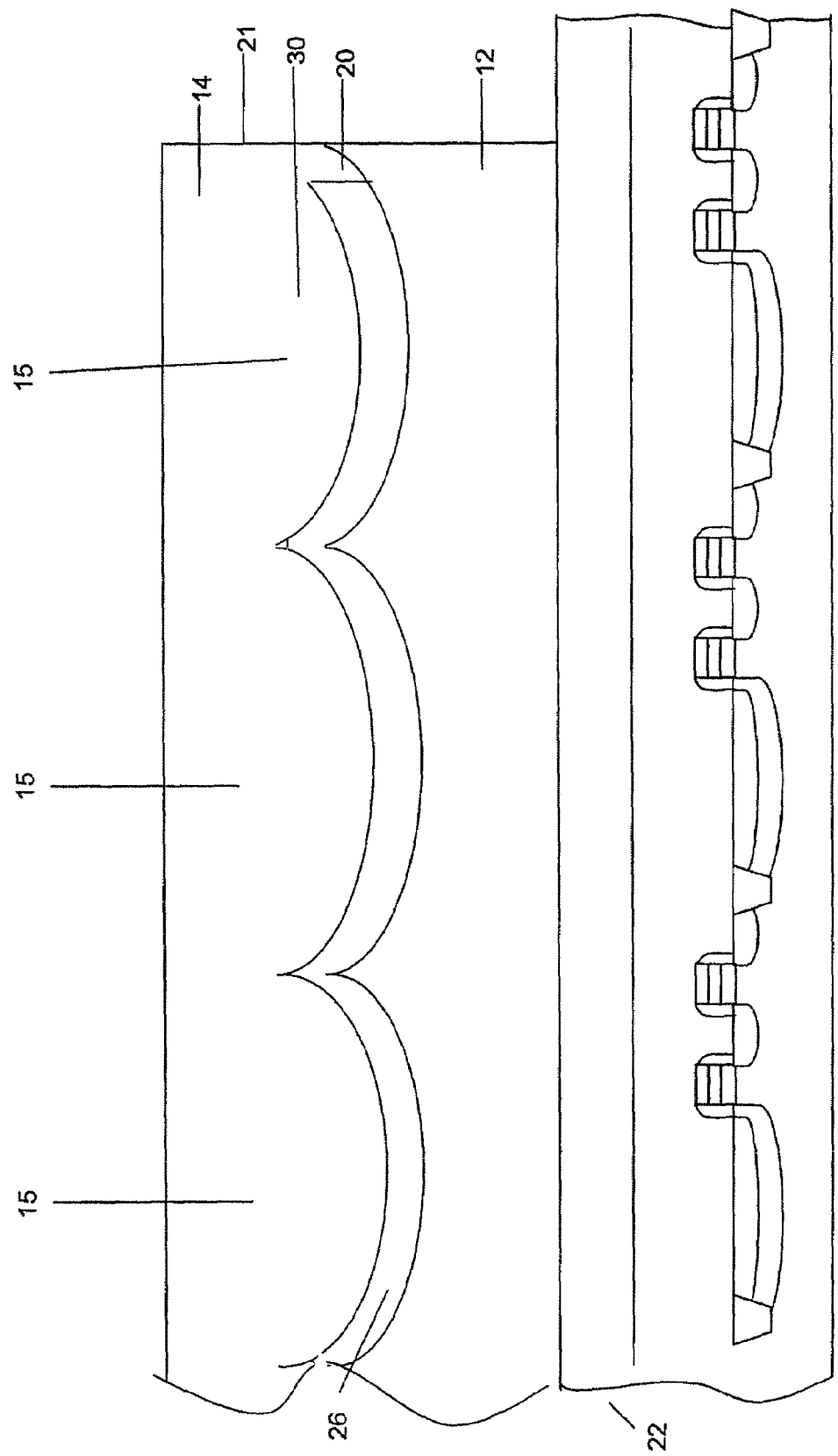
FIG. 5g is an enlarged cross-sectional view of the embodiment of the image sensor of FIG. 3 during fabrication, having a first micro-lens array and supports formed therein.

Referring to FIG. 5g, supports 20 are formed by filling support molds 52 (shown in FIG. 5f) with a suitable support material. Suitable support materials are those that are a least substantially non-reflective and that are strong enough to support the upper layers of the image sensor 11 (FIG. 3). In addition, the first micro-lens array 14, including one or more first micro-lenses 15, is formed by coating the sacrificial material 26 (including the lens mold 29 formed therein), thereby filling the lens molds 29, with a first micro-lens material 30, such as for example an $SiO_2$ layer.

In a desired embodiment, both supports 20 and first micro-lens array 14 are comprised of the first micro-lens material 30. In accordance therewith, both the supports 20 and the first micro-lens array 14 are formed by coating the sacrificial material 26 with the first micro-lens material 30. The first micro-lens material 30 fills the support molds 52 to form the supports 20, and also fills the lens molds 29 to form the first micro-lens array 14.

Figure 5H:
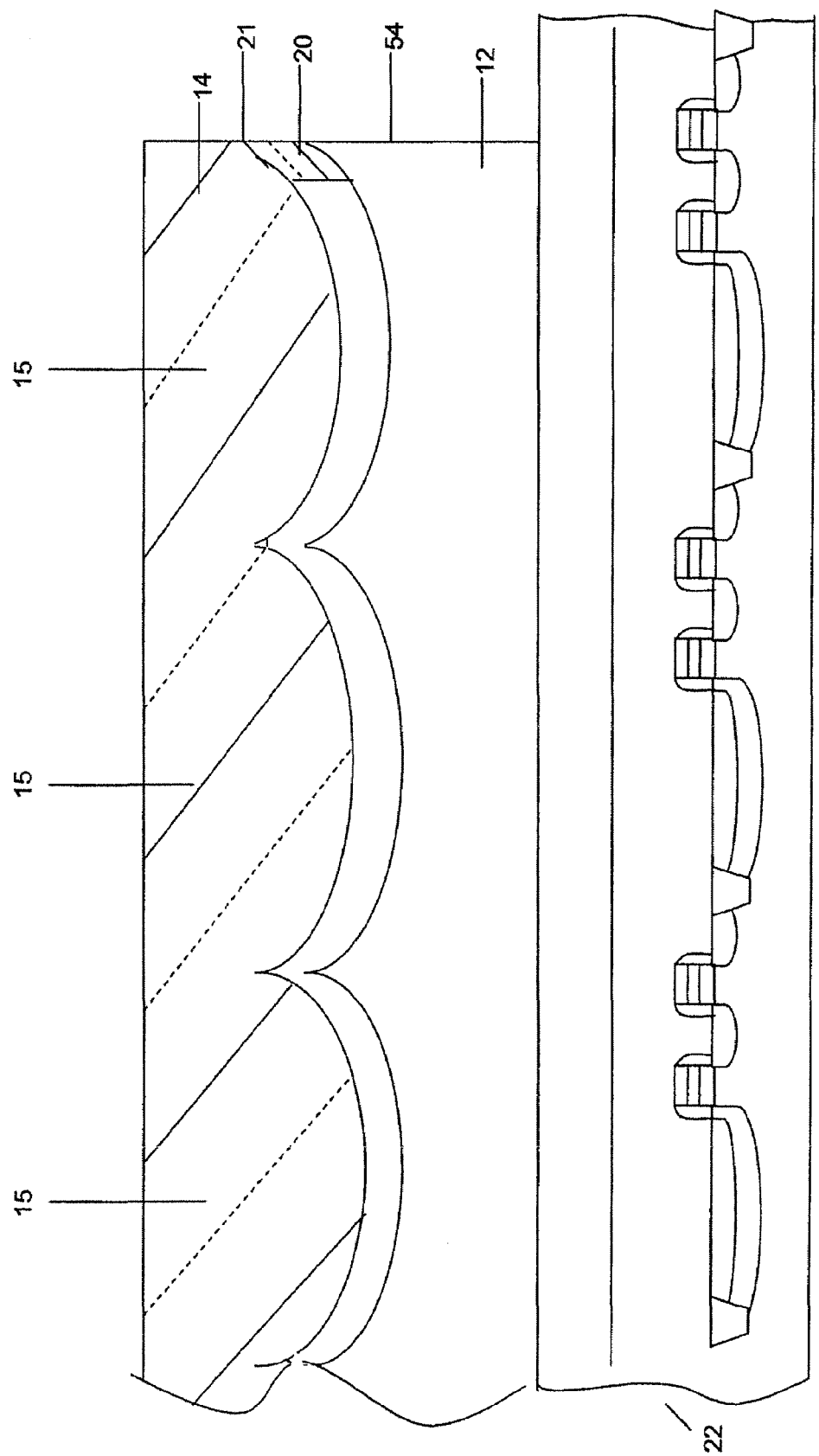
FIG. 5h is an enlarged cross-sectional view of the embodiment of the image sensor of FIG. 3 during fabrication, having a first micro-lens array and supports formed therein of different materials.

Alternatively, as shown in FIG. 5h, supports 20 may be comprised of a material other than the first micro-lens material (used to form first micro-lens array 14) that is sufficiently non-reflective and strong. For example if $SiO_2$ is the first micro-lens material, a suitable material for forming the supports 20 may be, for example, silicon nitride. In such case, supports 20 are preferably formed by filling the support molds 52 with the support material before the lens molds 29 are filled with the first micro-lens material 30.

Figure 5I:
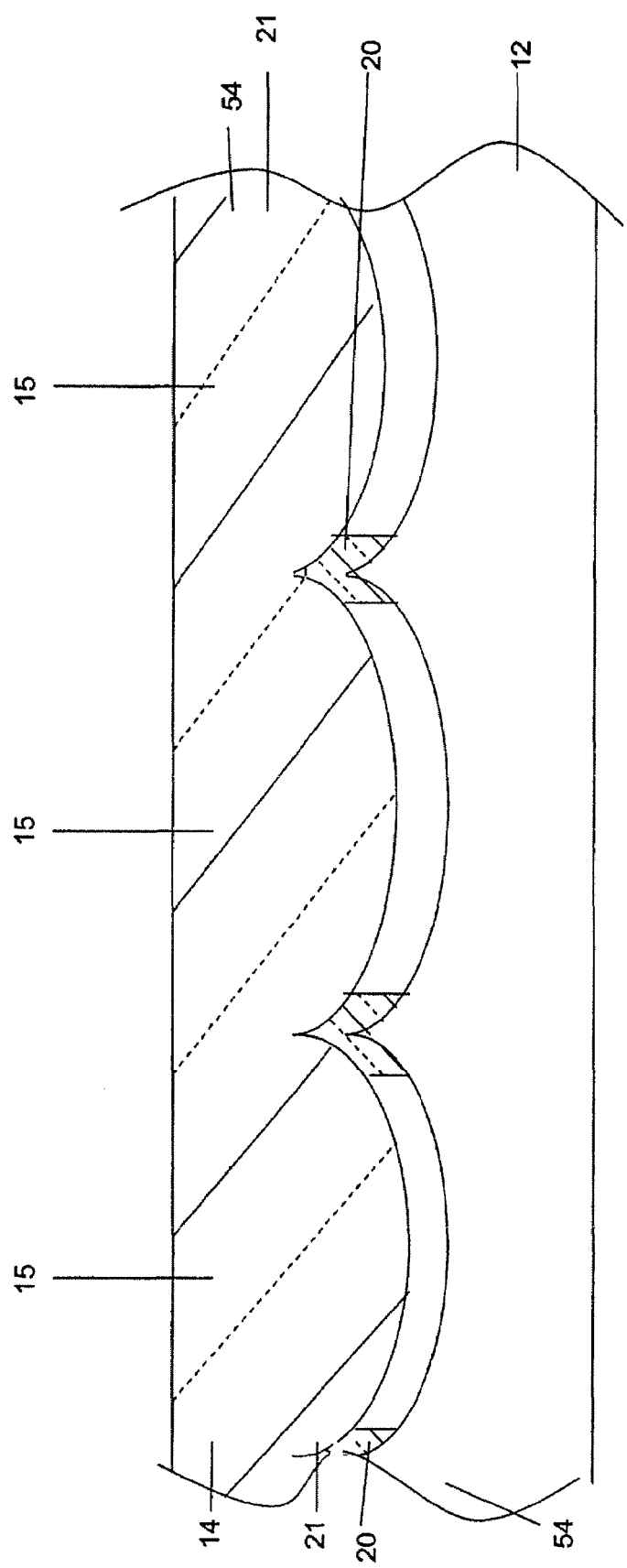
FIG. 5i is an enlarged cross-sectional view of the first micro-lens array and second micro-lens array of an embodiment of the image sensor of FIG. 3 during fabrication, having sacrificial material exposed at a side plane.

The supports molds 52 may be located at any position such that the supports 20 will be positioned to help support the first layers of the image sensor 11 (including first micro-lens array 14) such as, for example, at edges 21 as shown in FIG. 5f. Preferably, as shown in FIG. 5g, the supports 20 are comprised of one or more posts positioned at the edges 21 of the image sensor 11. As shown in FIGS. 5h and 5i, posts may be interspersed at the edges 21 along a side plane 54 of the image sensor 11.

In an alternative embodiment of the invention, posts may be positioned internally of edges 21 (as illustrated in FIG. 3b) at areas within cavity 16 at least substantially outside of the areas wherein incoming light Z is directed from the first micro-lenses 15 to the second micro-lenses 13.

There may be circumstances (due to e.g., equipment limitations) in which it is not feasible to selectively control the application of chemical etching solutions to etch the support molds 52 and the lens molds 29 in a sacrificial material 26 using a sacrificial photo resist having both support openings 51 and sacrificial resist openings 28 developed therein. In such a case, it is desired to form the support openings 51 and to etch the support molds 52 (e.g., using an anisotropic etching solution) prior to forming sacrificial resist openings 28 and etching lens molds 29. After forming support molds 52, a new layer of sacrificial photo resist 27 may be applied to the sacrificial material 26 and sacrificial resist openings 28 developed in the sacrificial photo resist 27, and lens molds 29 etched there through (e.g., using an isotropic etch). The sacrificial photo resist 27 may be stripped, if needed, using known stripping techniques. It should be noted that the sacrificial resist openings 28 and lens molds 29 may alternatively be formed prior to forming the support openings 51 and etching support molds 52.

Additionally, if the support material is not the first micro-lens material 30, there may also be circumstances (such as those due to equipment limitations) in which it is not feasible to selectively control the application of the support material or the first micro-lens material 30 to a sacrificial material 26 having both the support molds 52 and the lens molds 29 formed therein. In such a case, support molds 52 are preferably formed prior to forming lens molds 29. Support molds 52 may then be filled with the support material to form supports 20, as shown in FIG. 5h. Excess support material may be removed from the sacrificial material using conventional techniques such as by applying chemical solutions and planarization techniques. Lens molds 29 may then be formed and filled with the first micro-lens material 30 to form the first micro-lens array 14 (shown in FIG. 5h). Alternatively, lens molds 20 may be formed and filled (and excess first micro-lens material 30 removed from the sacrificial material by conventional techniques such as by using chemical solutions or planarization) prior to forming and filling support molds 52.

Referring to FIG. 5g, sacrificial material 26 is removed to form cavity 16 which provides the embodiment shown in FIG. 3. The sacrificial material 26 may be removed by heat or chemical removal methods such as by heating the sacrificial material 26 or, in the case of a chemical sacrificial material to which a resist has been applied, by treating sacrificial material 26 with solvents or chemicals to remove the resist and sacrificial material 26. As would be known by those of ordinary skill in the art, manufacturers of sacrificial materials may provide recommended removal methods (e.g., heat or chemical) and corresponding process conditions (e.g., temperature or time of removal treatment) for a given sacrificial material.

In a preferred embodiment of the invention, the sacrificial material 26 is removed by heating the sacrificial material to its degradation point. Such heat removal technique may produce a very clean removal such that no additional clean steps are required to remove residual particles.

There may be situations in which a single clean technique (such as heat or chemical removal) does not provide a sufficiently clean image sensor. In such cases, additional clean steps may be desired or required to remove residual sacrificial material or, to remove other residual particles (for example, particles that may remain after a chemical removal). In accordance with an alternative embodiment, additional clean steps, may be provided by the formation and use of vacuum channels 31.

Figure 6A:
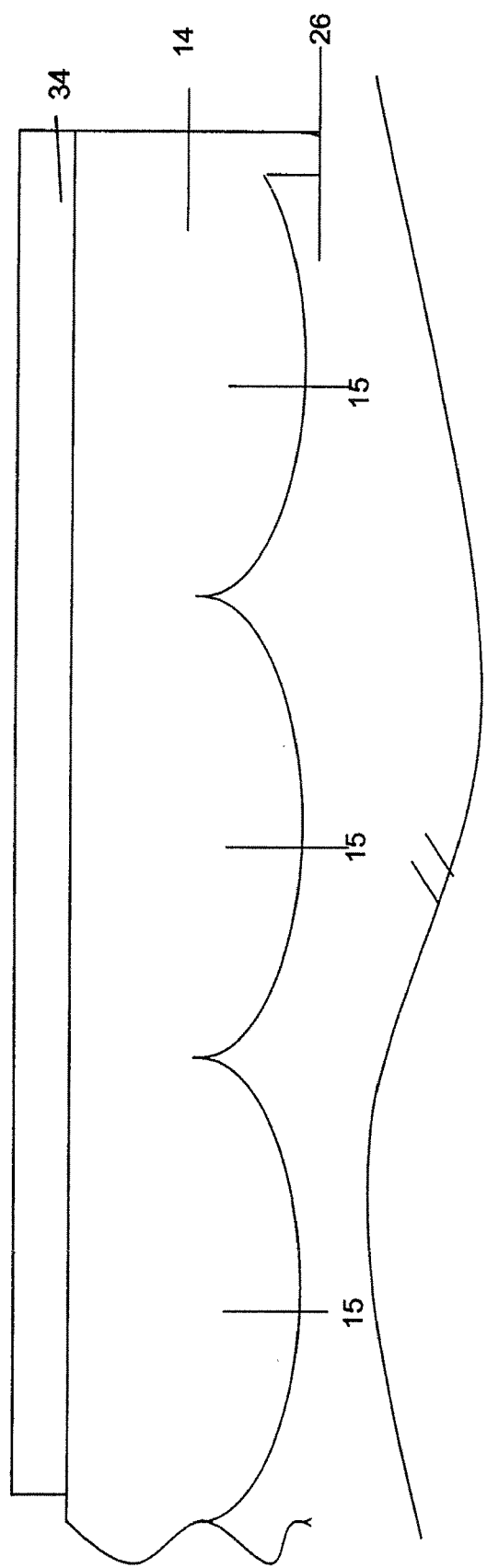
FIG. 6a is an enlarged cross-sectional view of a stage of fabrication of vacuum channels for an image sensor, having a vacuum photo resist applied thereto.

The formation of vacuum channels 31 is now described with reference to FIGS. 6a through 6c. Referring to FIG. 6a, vacuum openings 35 may be formed by applying a vacuum photo resist layer 34 on top of the first micro-lens array 14. The vacuum photo resist layer 34 may be applied by conventional methods, such as for example by spin coating methods.

Figure 6B:
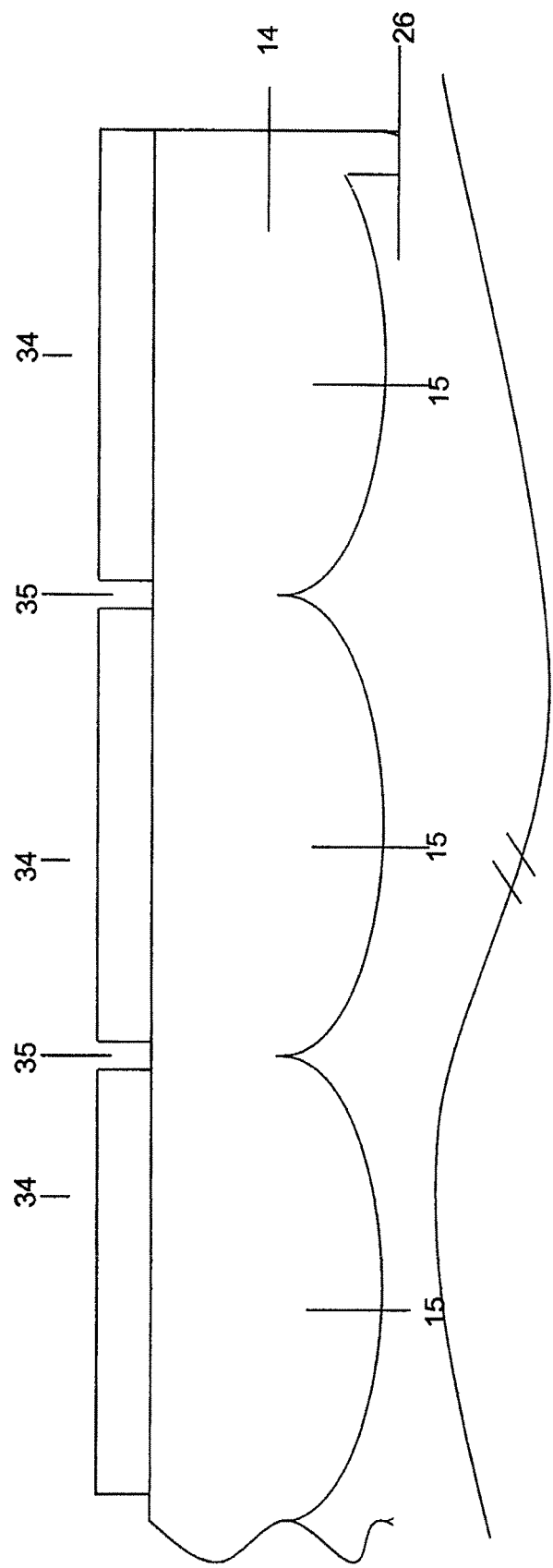
FIG. 6b is an enlarged cross-sectional view of a stage of fabrication of vacuum channels for an image sensor, having vacuum openings formed therein.
Figure 6C:
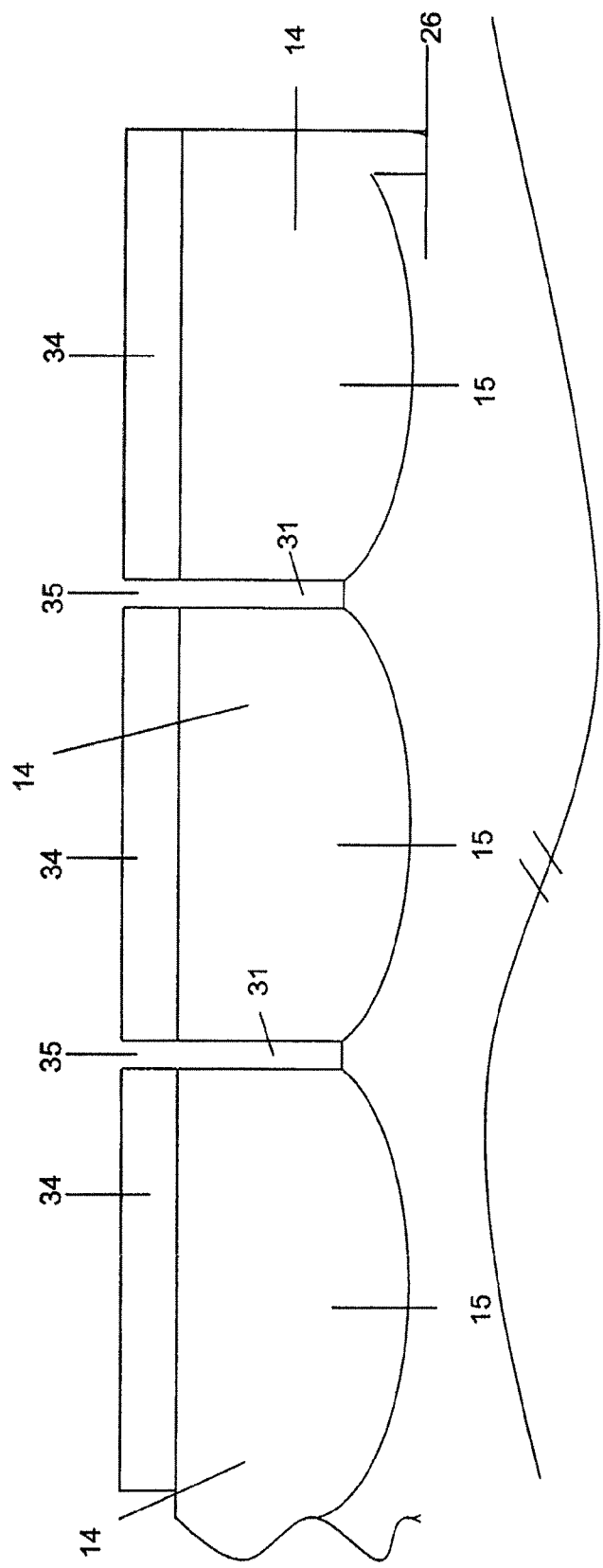
FIG. 6c is an enlarged cross-sectional view of a stage of fabrication of vacuum channels for an image sensor, having vacuum channels formed therein.

As shown in FIG. 6b, the vacuum photo resist layer 34 is exposed, and one or more vacuum openings 35 are developed therein. The vacuum photo resist layer 34 may be exposed by conventional methods such as by masking and developing away desired areas of the photo resist, leaving vacuum openings 35. The vacuum openings 35 should be formed above the non-collimating portions of the first micro-lens array 14. Referring to FIG. 6c, vacuum channels 31 are formed by etching through the first micro-lens array 14 to the sacrificial material 26. The etching process may be by conventional means, such as by chemical etching. Preferably, the etching process forms vacuum channels 31 of substantially columnar shape. For example, an anisotropic chemical etch may be used to produce substantially columnar shaped vacuum channels 31. After formation of the vacuum channels 31, it is desirable to remove the vacuum photo resist 34 such as by conventional stripping.

Figure 6D:
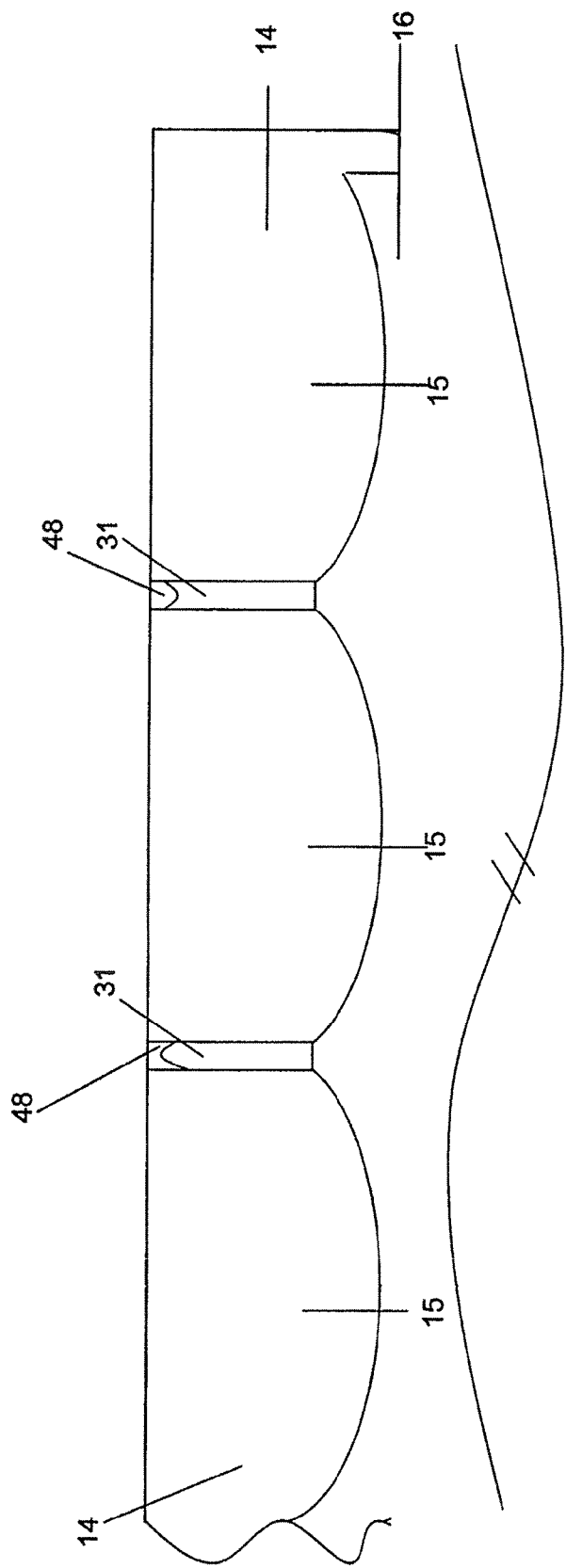
FIG. 6d is an enlarged cross-sectional view of a stage of fabrication of vacuum channels for an image sensor, having plugged vacuum channels.

The vacuum channels 31 may then be used to remove residual particles that remain after degrading the sacrificial material. The vacuum channels 31 are formed after forming the first micro-lens array, but preferably before cavity 16 is formed by removing sacrificial material 26 (e.g., before degrading the sacrificial material such as by heating or chemical treatment). After the sacrificial material 26 is removed to form cavity 16, it is desirable to plug the vacuum channels 31 by applying a conventional filler material 48, such as a glue, to the outer opening of the vacuum channels 31 as shown in FIG. 6d.

The vacuum channels 31 alternatively may be located at other areas in the image sensor 11. If the vacuum channels 31 are formed by fabricating a channel or opening through a micro-lens array of the image sensor 11, the vacuum channels 31 should be located in areas that are at least substantially outside of the non-collimating and non-focusing areas of the micro-lens array.

As shown in FIG. 5i, if the sacrificial material 26 is exposed at areas along one or more side planes 54 of the image sensor 11, then sacrificial material 26 may be removed by vacuuming through one or more exposed areas. Exposed areas of sacrificial material 26 may be formed in a side plane 54 of an image sensor 11, for example, when a series (i.e., multiple) image sensors 11 are fabricated during processing. It is common when fabricating a series of image sensors 11, that a side plane 54 of one image sensor 11 is connected to a side plane 54 of an adjacent image sensor 11 until the final stages of fabrication, at which time each image sensor 11 is separated from the adjacent image sensor 11. As a result of this separation, a side plane 54 of an image sensor 11 may have areas of exposed sacrificial material 26, as shown in FIG. 5i, through which the sacrificial material 26 may be removed by vacuuming.

Figure 7A:
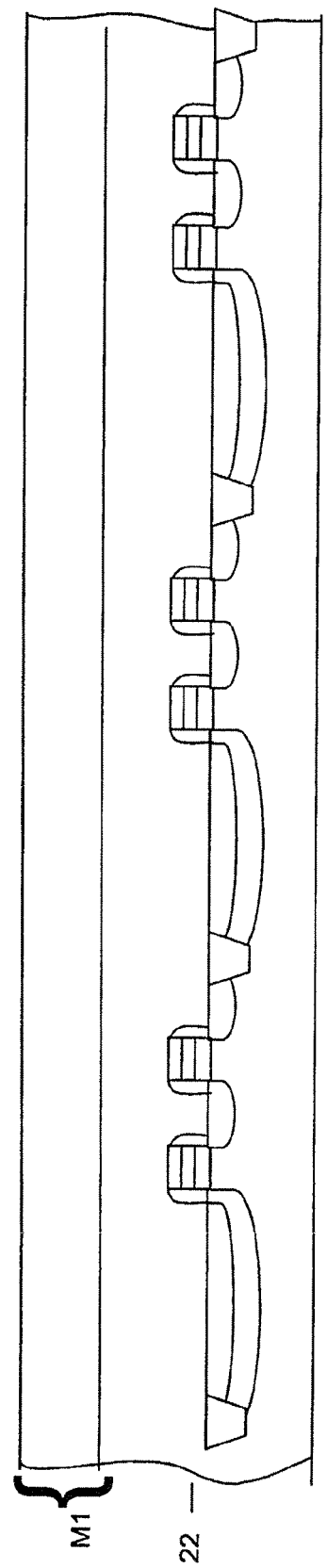
FIG. 7a is an enlarged cross-sectional view of the embodiment of the image sensor of FIG. 4 during fabrication, having a substrate provided.
Figure 7B:
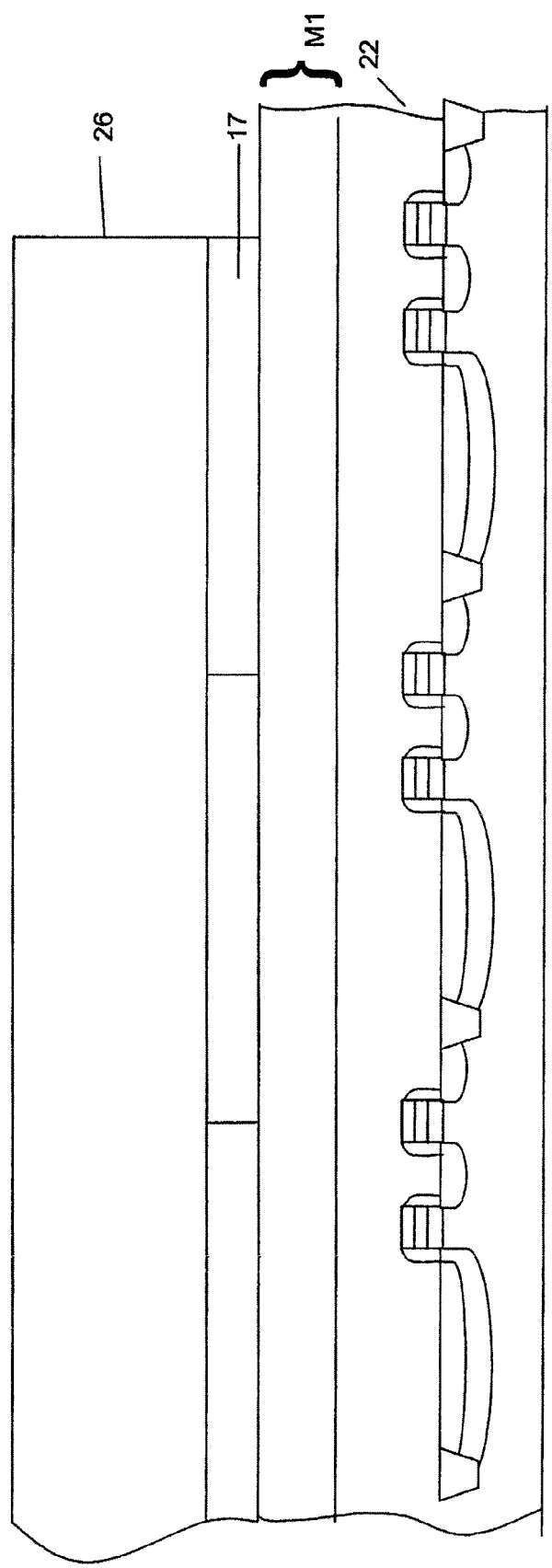
FIG. 7b is an enlarged cross-sectional view of the embodiment of the image sensor of FIG. 4 during fabrication, having a sacrificial material applied.

The method of fabricating the embodiment of the invention shown in FIG. 4 is now described with reference to FIG. 7a through FIG. 7g. As shown in FIG. 7a, a semiconductor substrate 22 is provided having an M1 layer. As shown in FIG. 7b, a sacrificial material 26 is applied on top of the M1 layer. It is preferred however, that the color filter array 17 is first provided on top of the M1 layer and then the sacrificial material 26 applied on top of color filter array 17. Examples of suitable sacrificial materials include materials that can be suitably etched and removed from the image sensor, such as for example photosensitive polycarbonates. The sacrificial material 26 may be applied by conventional application methods such as by spin coating the sacrificial material onto the color filter array 17.

Figure 7C:
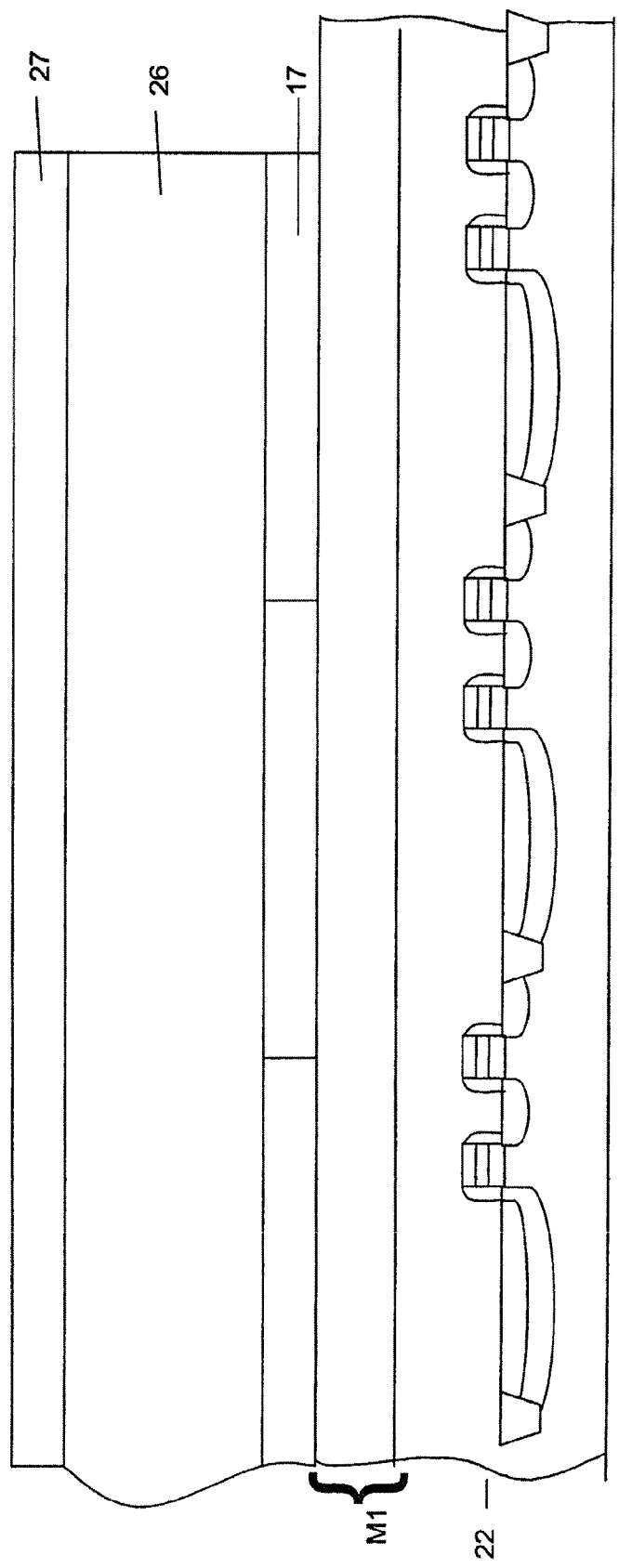
FIG. 7c is an enlarged cross-sectional view of the embodiment of the image sensor of FIG. 4 during fabrication, having a sacrificial photo resist applied.

As shown in FIG. 7c, a sacrificial photo resist 27 is applied on top of the sacrificial material 26. The sacrificial photo resist 27 may also be applied by conventional methods such as spin coating.

Figure 7D:
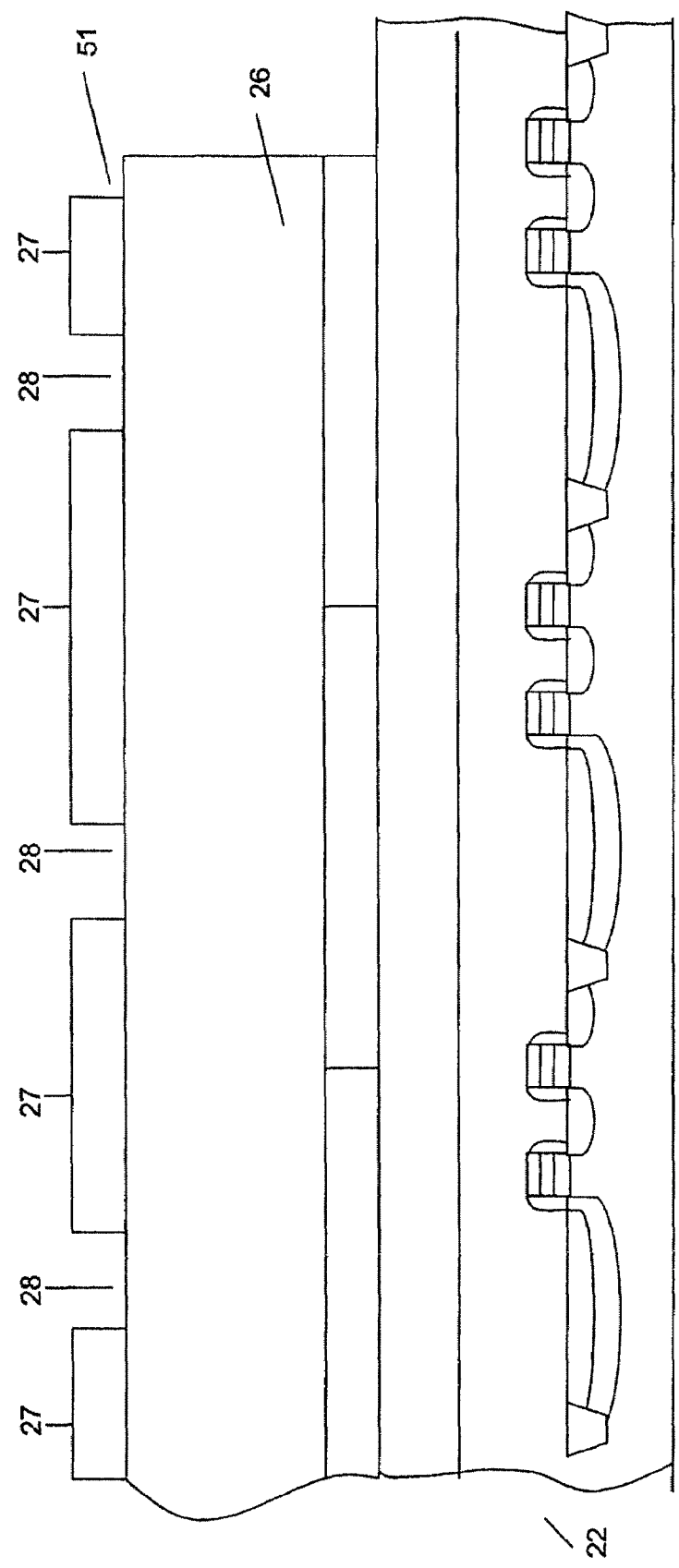
FIG. 7d is an enlarged cross-sectional view of the embodiment of the image sensor of FIG. 4 during fabrication, having a sacrificial resist openings, and support openings formed therein.

Referring to FIG. 7d, the sacrificial photo resist 27 is exposed and areas are developed away to form sacrificial resist openings 28. The sacrificial photo resist 27 may be exposed by conventional methods such as by masking and developing away desired areas of the photo resist, leaving sacrificial resist openings 28.

As also illustrated in FIG. 7d, the sacrificial photo resist 27 is exposed and areas developed away to form one or more support openings 51. The sacrificial photo resist 27 may be exposed by conventional methods such as by masking and developing away desired areas of the photo resist, leaving support openings 51. Preferably, the support openings 51 are formed in conjunction with the step of forming sacrificial resist openings 28.

Figure 7E:
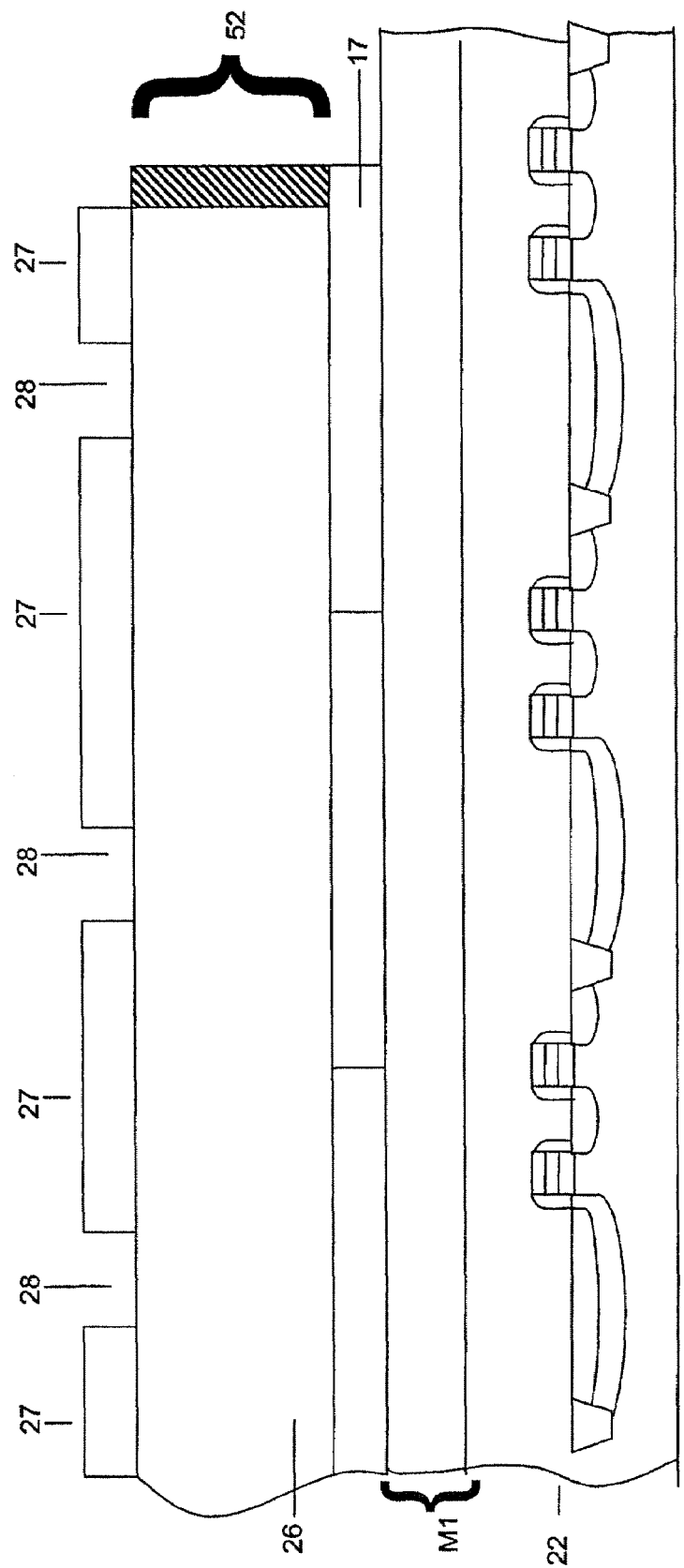
FIG. 7e is an enlarged cross-sectional view of the embodiment of the image sensor of FIG. 4 during fabrication, having a support mold formed therein.
Figure 7F:
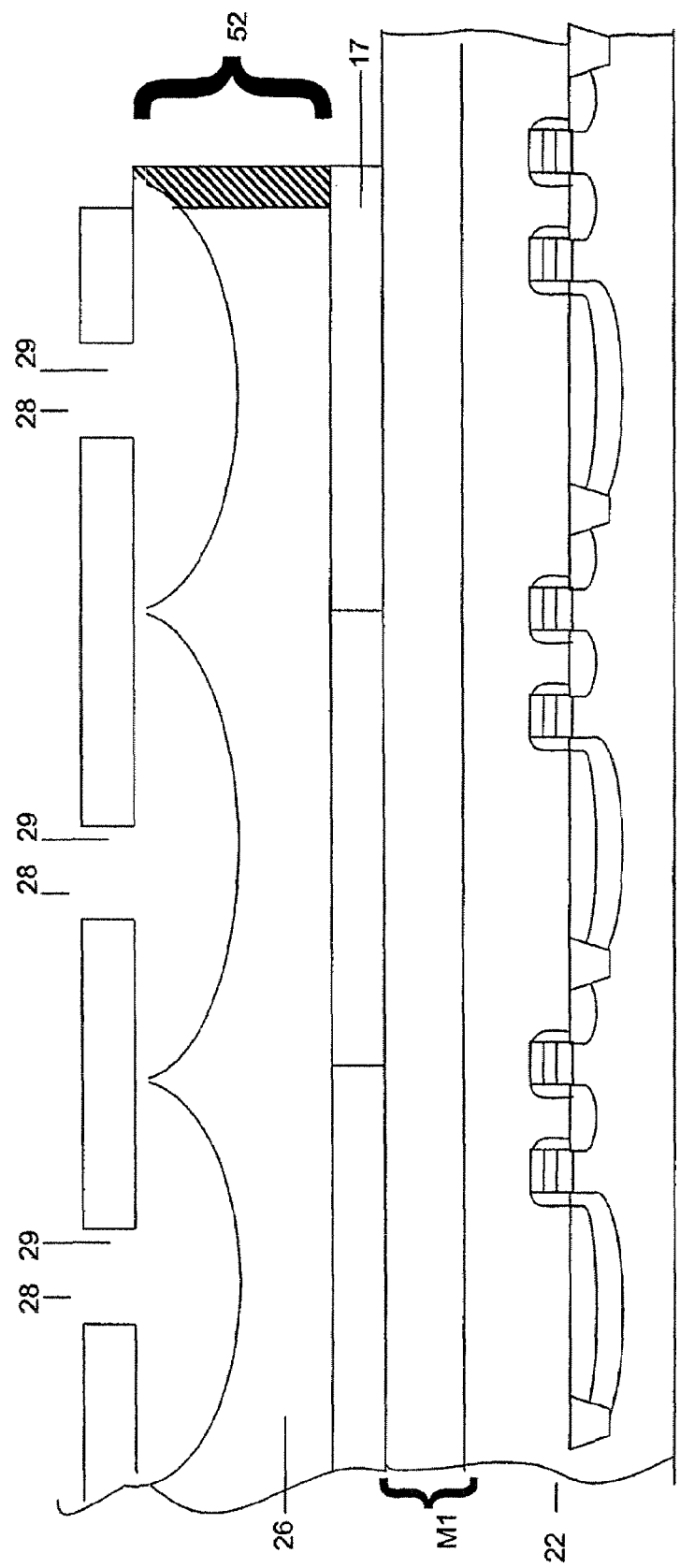
FIG. 7f is an enlarged cross-sectional view of the embodiment of the image sensor of FIG. 4 during fabrication, having lens molds formed therein.

Referring to FIG. 7e, support molds 52 are formed in the sacrificial material 26. The support molds 52 may be etched by conventional methods, such as by applying a chemical etching solution followed by a rinse. Preferably, an anisotropic chemical etch is used to etch columnar support molds, corresponding to the width and length (in the surface plane) of the support openings 51, through the sacrificial material to the adjacent lower level. Preferably this adjacent lower level is the color filter array 17 as shown in FIG. 7e, but different configurations are also applicable. For example, the adjacent lower level may be the M1 layer.

As illustrated in 7f, lens molds 29 are formed in the sacrificial material 26. In a preferred embodiment of the invention, lens molds 29 may be etched by applying a chemical etching solution followed by a rinse to stop the etching process. Preferably, the chemical etching solution is an isotropic etch solution (i.e, a solution that etches the sacrificial material 26 at the same rate in all directions). An isotropic chemical etch forms a concave lens molds 29 of hemispherical shape.

Figure 7G:
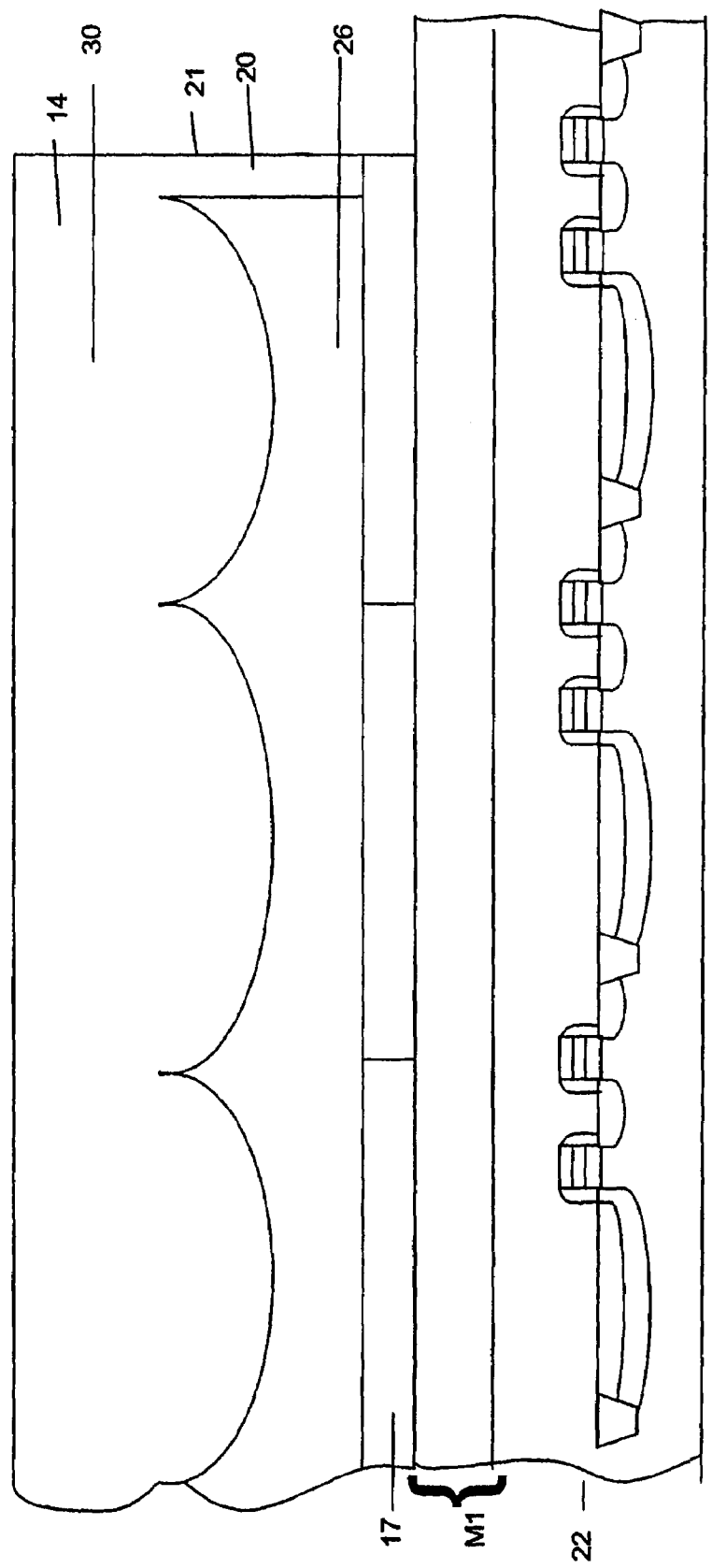
FIG. 7g is an enlarged cross-sectional view of the embodiment of the image sensor of FIG. 4 during fabrication, having a first micro-lens array and supports formed therein.

Referring to FIG. 7g, supports 20 are formed by filing support molds 52 (shown in FIG. 7f) with a suitable support material. Suitable support materials are those that are a least substantially non-reflective and that are strong enough to support the upper layers of the image sensor 11. Supports molds 52 (FIG. 7f) may be located at any positions such that supports 20 formed thereby are capable of helping to support the first layers of the image sensor 11, including the first micro-lens array 14. As also shown in FIG. 7g, lens molds 29 (illustrated in FIG. 7f) are filled with the first micro-lens material 30 to form the first micro-lens array 14.

Preferably, both supports 20 and first micro-lens array 14 are comprised of the first micro-lens material 30. In such case, supports 20 and first micro-lens array 14 may be formed by coating the sacrificial material 26 with the first micro-lens material 30. The first micro-lens material 30 fills the support molds 52 to form the supports 20 and fills the lens molds 29 and to form the first micro-lens array 14. Preferably, the first micro-lens material 30 is $SiO_2$.

Alternatively, supports 20 may be formed separately of the first micro-lens array 14. For example, supports 20 may be formed before the lens molds 29 are filled with the first micro-lens material 30, in which case, supports 20 may be comprised of a material other than the first micro-lens material 30. Suitable materials are those that are at least substantially non-reflective and that have sufficient strength to support the upper layers of the image device 11 including the first micro-lens array 14. Where, for example, the first micro-lens material 30 is $SiO_2$, a different suitable support material such as silicon nitride may be used.

Preferably, as shown in FIG. 7g, the supports 20 are comprised of one or more posts positioned at the edges 21 of the image sensor 11. If supports 20 are located internally of the edges 21, support molds 52 (shown in FIG. 7f) should be positioned at locations that are at least substantially outside of the areas through which light is directed from the first micro-lens array 14 to the lower levels of the image sensor 11 (e.g., to the color filter array 17).

In fabricating the embodiment shown in FIG. 4, the sacrificial material 26 (shown in FIG. 7g) is removed by heat or chemical treatment to form the cavity 16 illustrated in FIG. 4. If additional clean techniques are necessary or desired, vacuum channels 31 may be formed by etching through the first micro-lens array to the sacrificial material as previously described with reference to FIGS. 6a-6d, or to FIG. 5i.

Figure 8A:
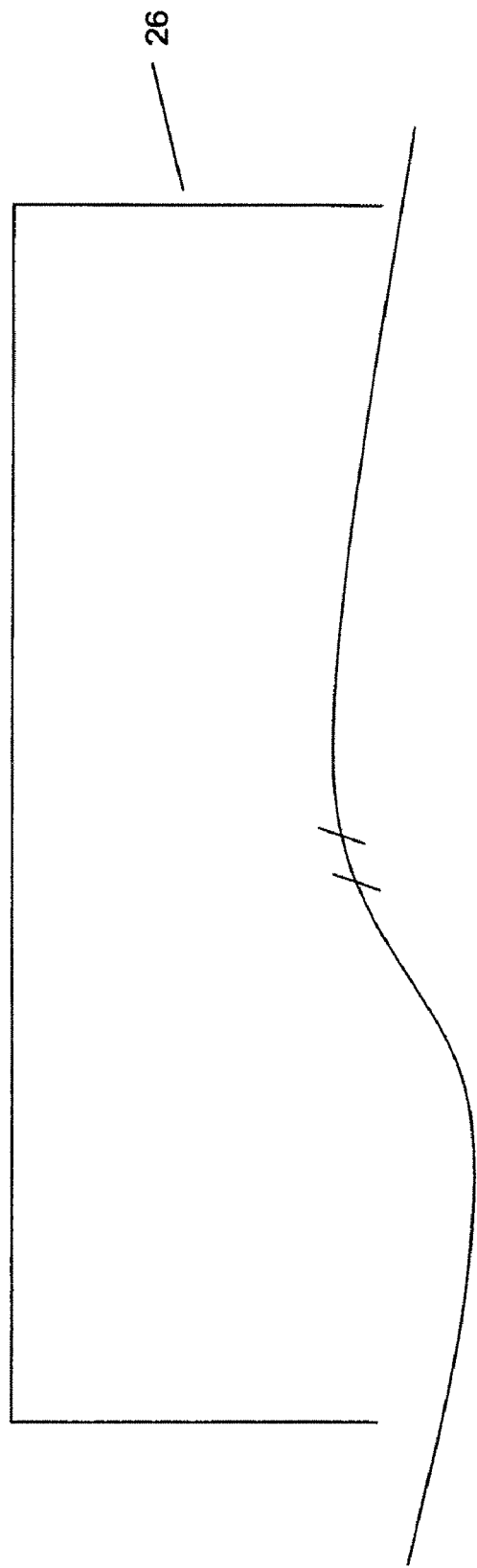
FIG. 8a is an enlarged cross-sectional view of a stage of fabrication of an image sensor having a sacrificial resist applied thereto.
Figure 8B:
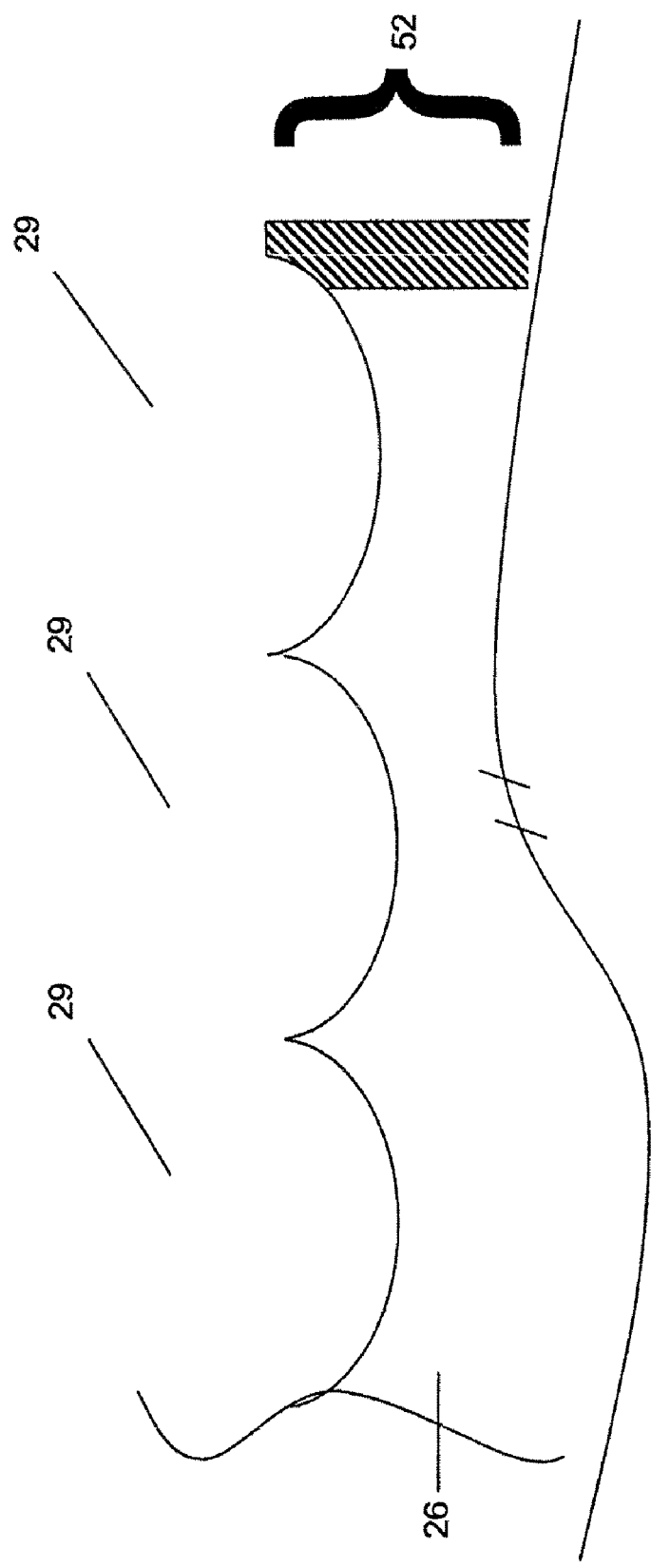
FIG. 8b is an enlarged cross-sectional view of a stage of fabrication of an image sensor, having a lens molds and support molds formed therein.

The fabrication of the lens molds 29 and support molds 52 of the embodiments shown in FIG. 3 and FIG. 4 has been described by photo resist and etching steps. Another method suitable for fabricating the lens molds 29 and support molds 52 of the FIG. 3 and FIG. 4 embodiments is now described with reference to FIGS. 8a-8b. According to this method, a sacrificial photo resist and subsequent masking and etching of a sacrificial photo resist are not required. As shown in FIG. 8a, the sacrificial material 26 is applied to the image sensor (e.g., to the second micro-lens layer when fabricating the embodiment of FIG. 3, or to the color filter array when fabricating the embodiment illustrated in FIG. 4). As shown in FIG. 8b, the sacrificial material may then be etched using conventional controlled laser etching techniques, such as for example stereo lithography techniques, to form lens molds 29 and support molds 52.

The present invention provides a simple apparatus and method for focusing light on a photo sensor without decreasing the depth of the photo sensor in the semiconductor wafer. Examples of suitable applications include digital imaging applications wherein light is transmitted to a light device of a pixel cell, and in digital image display applications wherein light is transferred from a pixel cell of a display device. The invention is particularly suitable for use in integrated circuit applications using semiconductor devices such as for example CMOS or CCD devices.

Figure 9A:
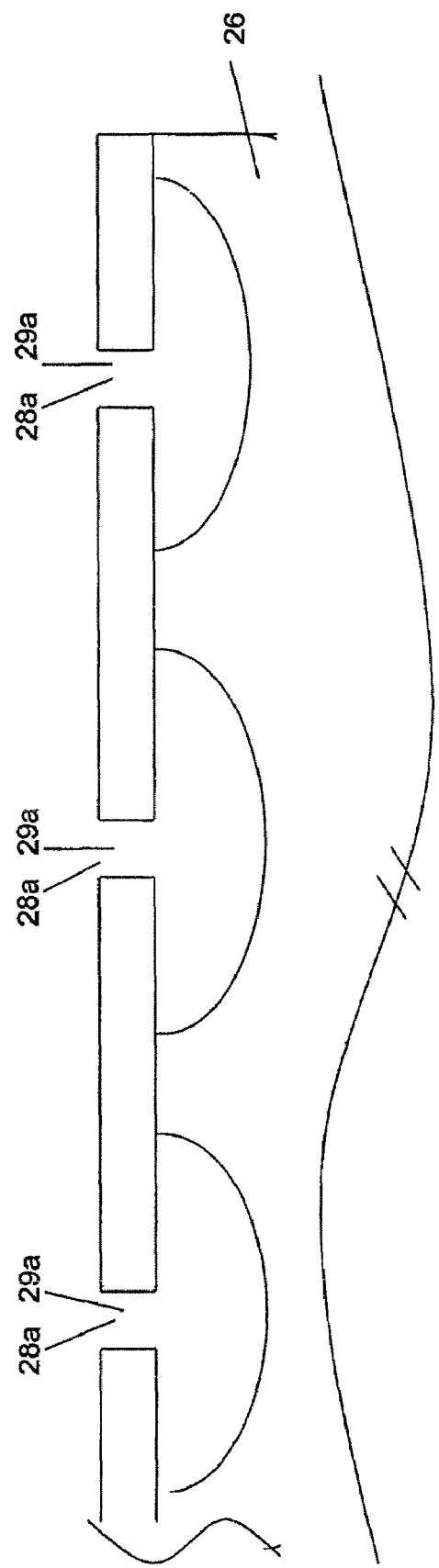
FIG. 9a is an enlarged cross-sectional view of lens molds formed during fabrication of micro-lenses.
Figure 9B:
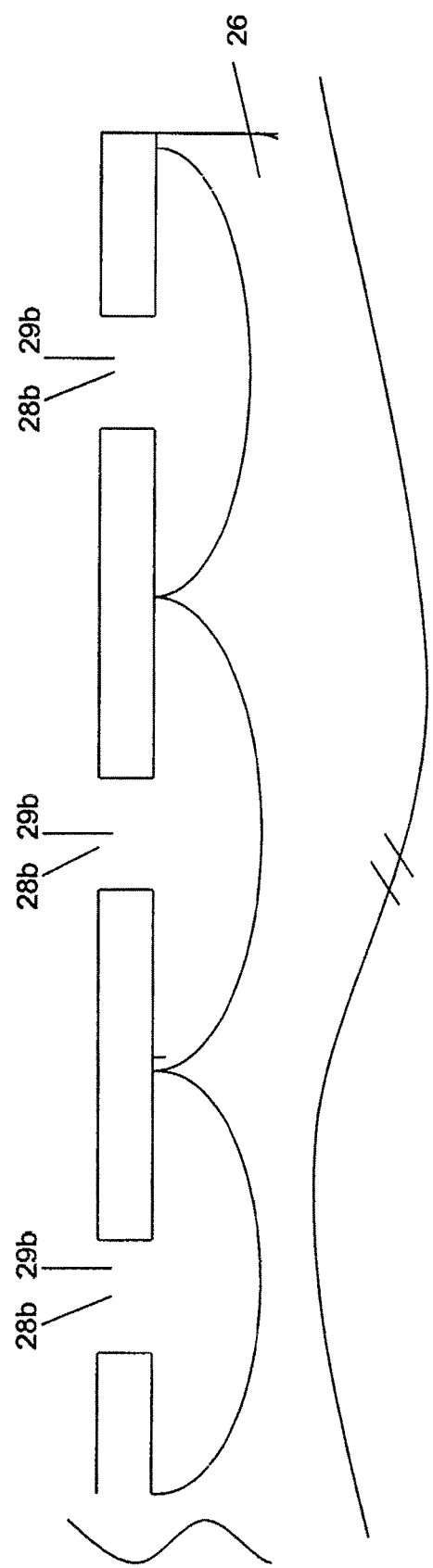
FIG. 9b is an enlarged cross-sectional view of the lens molds of FIG. 9a increased in widths.

The method of forming micro-lens arrays through use of a sacrificial material 26 provides micro-lenses with a desired geometry, and provides a cavity of a desired depth, such that the focal point of the micro-lenses is at a desired point in the substrate (i.e., is at the photo sensors). For example, when using an isotropic etch to form first micro-lenses 15 of a concave shape, the geometry of such micro-lenses may be adjusted by varying the size of the sacrificial resist openings 28 through which the lens molds are etched in the sacrificial material 26, and by controlling the exposure time of the chemical etching solution used to etch said lens molds 29. When using an isotropic etch, the amount of sacrificial material etched in the surface plane of the sacrificial material may be varied by varying the size of the sacrificial resist opening 28. Applying the chemical etching solution to a narrower sacrificial resist opening 28a will form a lens mold 29a (shown in FIG. 9a) that is narrower in the surface plane of the sacrificial material 26, but that is at the same depth perpendicular to the surface plane, relative to a lens mold 29b (shown in FIG. 9b) that is formed when the resist solution is applied to a wider sacrificial resist opening 28b.

The amount of sacrificial material 26 applied during fabrication can be controlled to provide a desired cavity depth, and a desired distance between the first micro-lens array 14 and the lower levels of the image sensor 11 (e.g., the color filter array 17 in the FIG. 4 embodiment or the second micro-lens array 12 in the FIG. 3 embodiment). For example, in a multi-array configuration like that shown in FIG. 3, using more sacrificial material 26 can create a first micro-lens array 14 that is located further away from the second micro-lens array 12 than if less sacrificial material 26 were used. Thus, an image sensor 11 having a desired focal point to which the first micro-lens array 14 and the second micro-lens array 12 direct light within the substrate 22 the micro-lenses can be provided.

Additionally, the depth of the lens molds 29 (and the depth of the cavity 16 that remains after the lens molds 29 are filled and sacrificial material 26 is removed), may be controlled by controlling the exposure time of the etching process.

Figure 10:
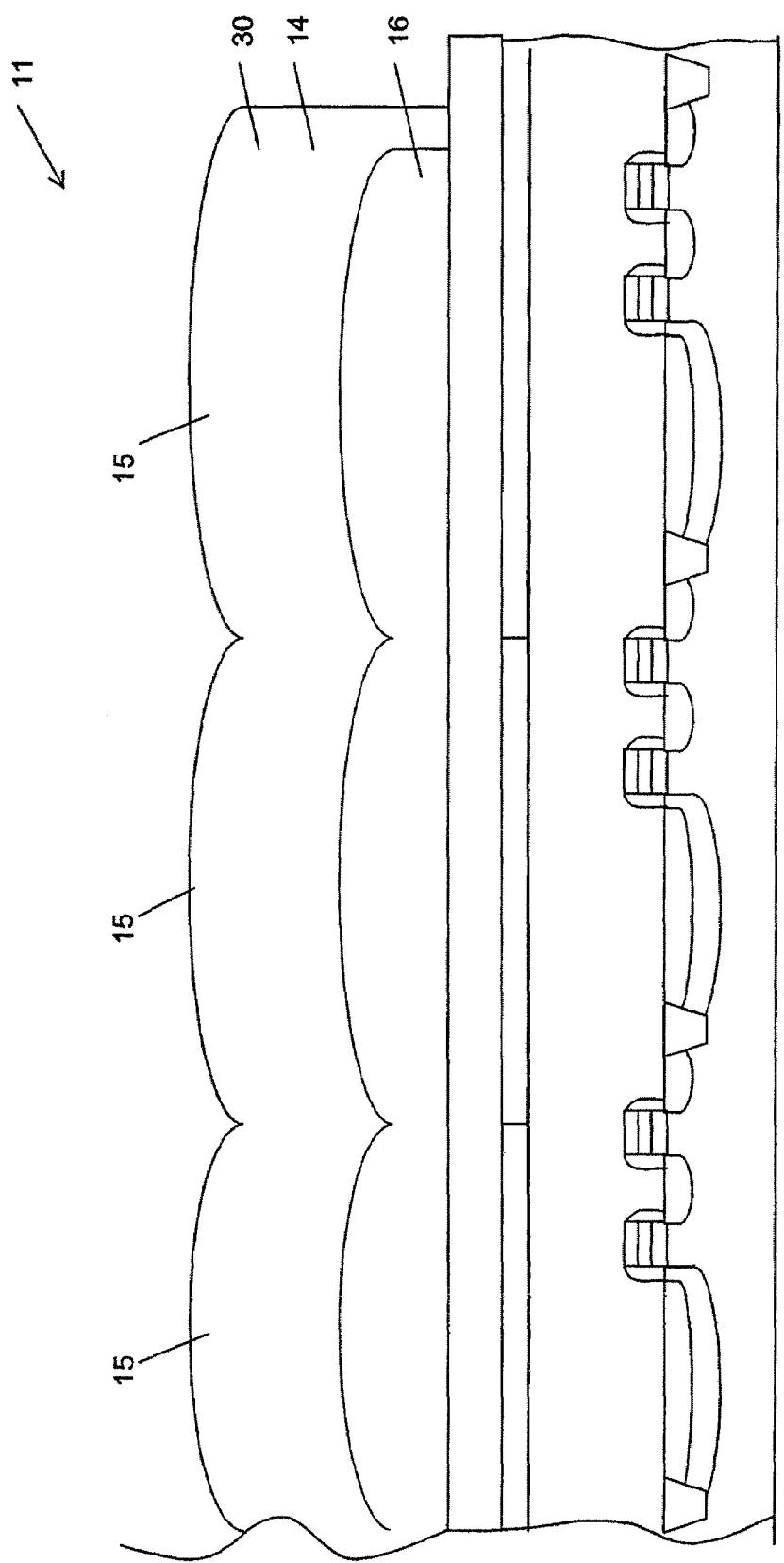
FIG. 10 is an enlarged cross-sectional view of an exemplary embodiment of the invention, having convex lens.

The lens configurations of the present invention are preferably concave configurations, but can include other lens configurations, such as for example the convex configuration shown in FIG. 10. FIG. 10 is a single array configuration that comprises a first micro-lens array 14 having convex first micro-lenses 15.

Figure 10A:
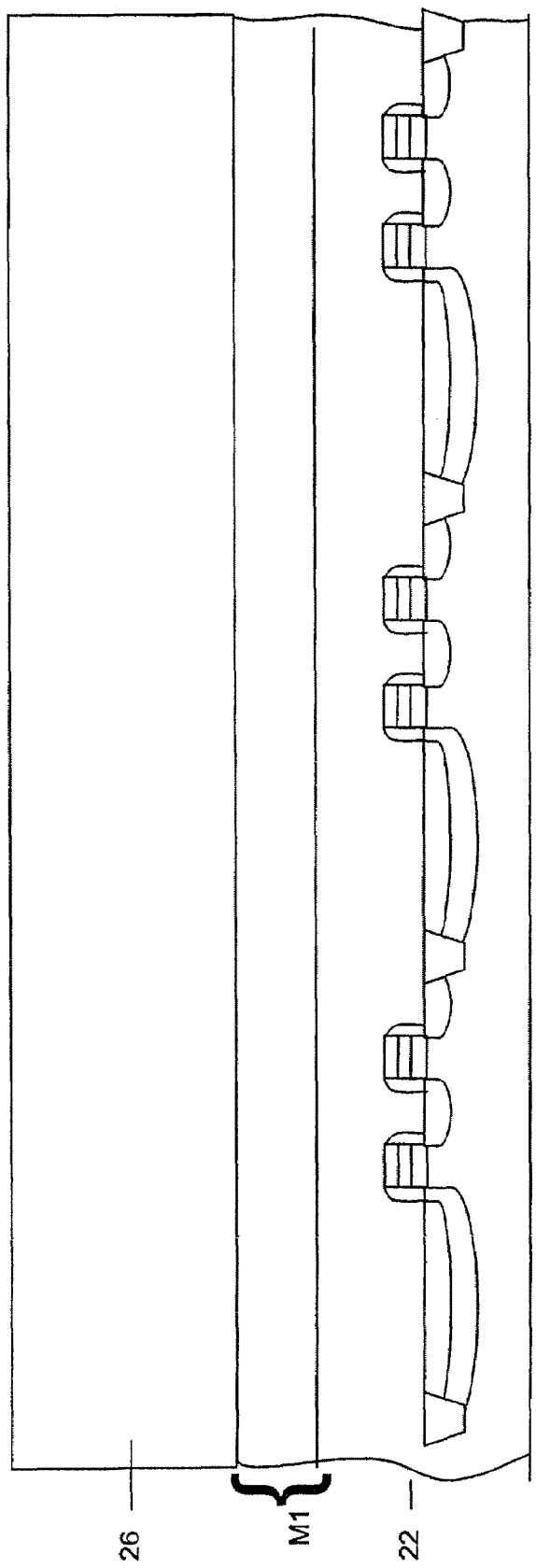
FIG. 10a is an enlarged cross-sectional view of the embodiment of the image sensor of FIG. 10 during fabrication, having a sacrificial resist applied thereto.
Figure 10B:
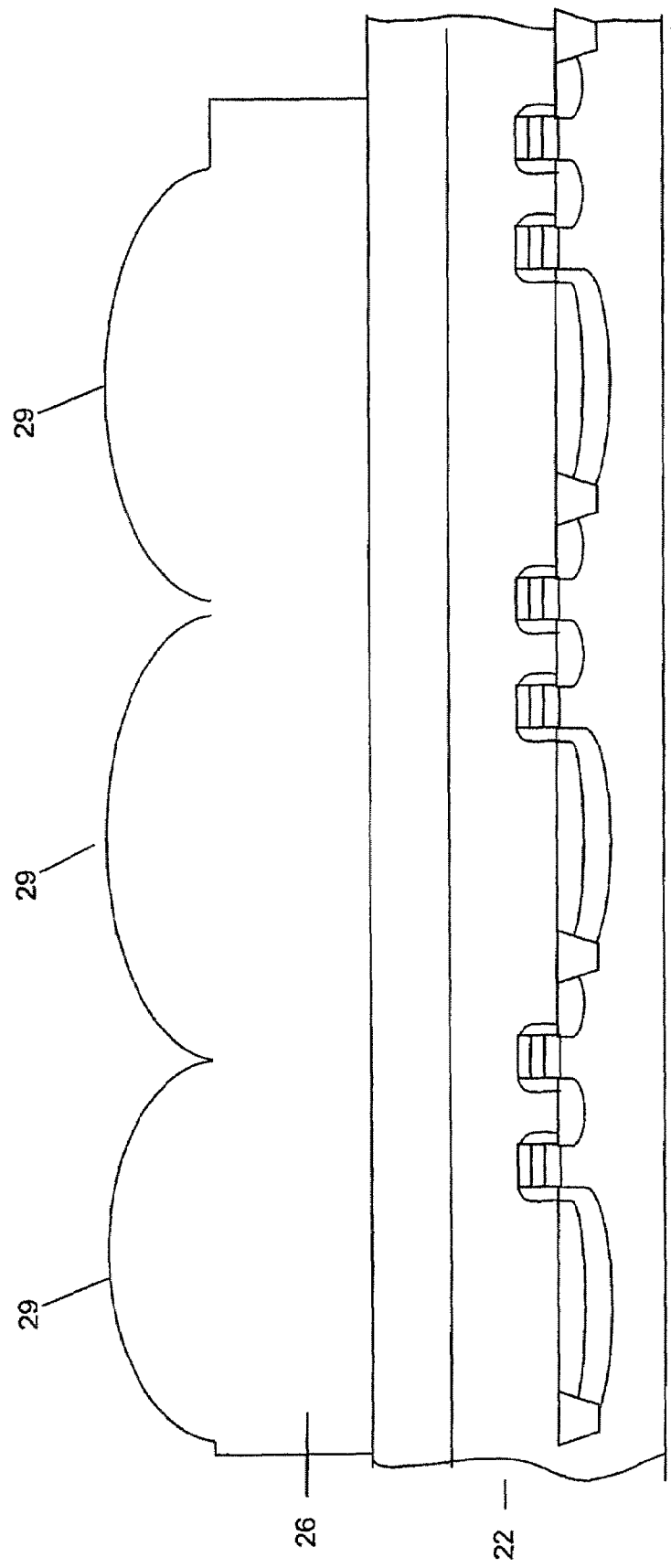
FIG. 10b is an enlarged cross-sectional view of the embodiment of the image sensor of FIG. 10 during fabrication, having convex lens molds formed therein.
Figure 10C:
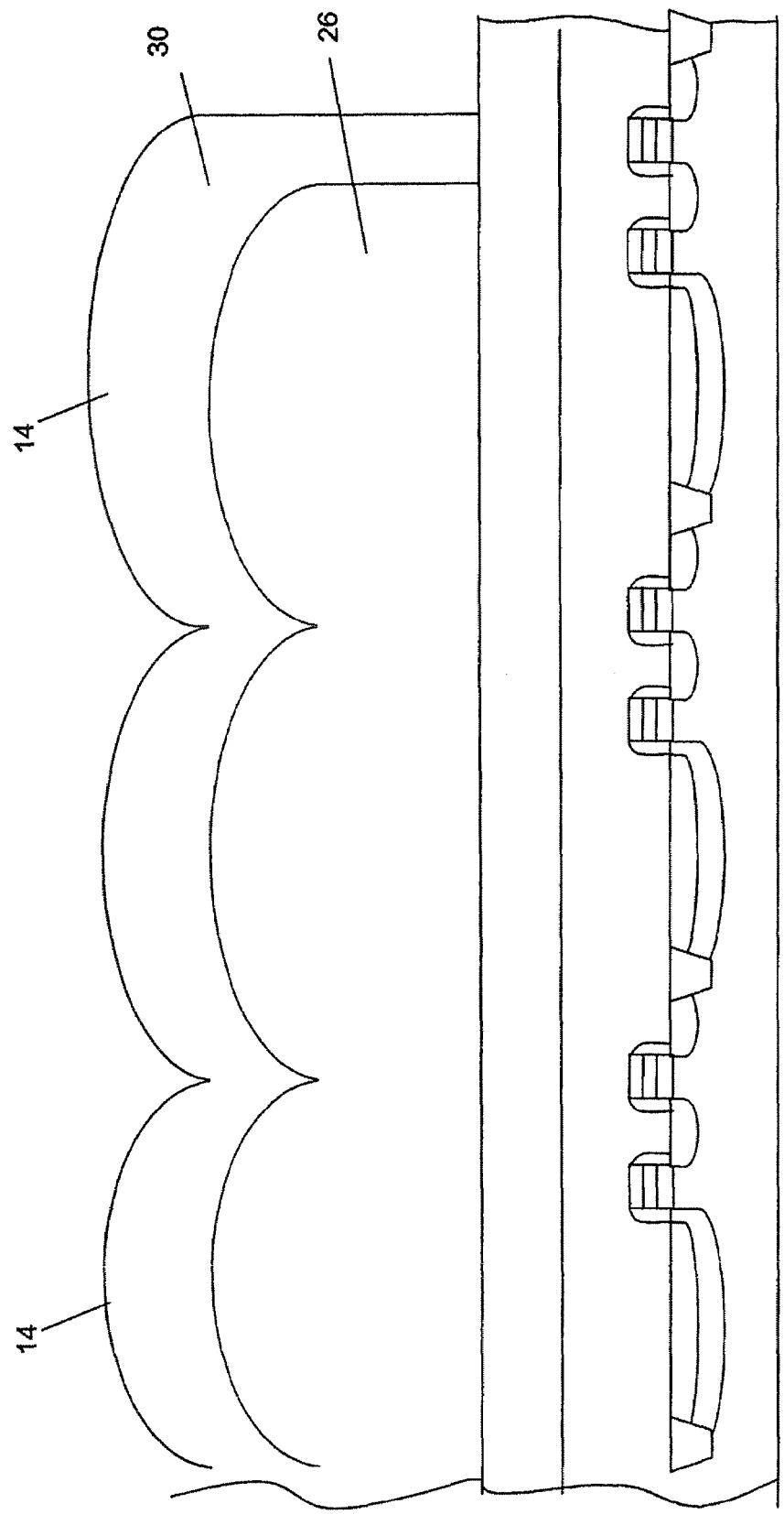
FIG. 10c is an enlarged cross-sectional view of the embodiment of the image sensor of FIG. 10 during fabrication, having a first micro-lens array formed thereon.

Convex first micro-lenses 15 may be formed by controlled laser etching (for example by stereo lithography) of the sacrificial material 26 after it is applied to the image sensor. The embodiment illustrated in FIG. 10 is formed by applying the sacrificial material 26 to the upper layer (e.g., the M1 layer) of a substrate 22 (shown in FIG. 10a), then forming convex lens molds 29 (such as by controlled laser etching) in the sacrificial material (shown in FIG. 10b), and forming a convex first micro-lens array 14 by filling the lens molds 29 with first micro-lens material 30 (shown in FIG. 10c), then removing the sacrificial material 26 to produce the image sensor of FIG. 10.

If multiple micro-lens arrays are desired for the image sensor 11, a second micro-lens array 12 having convex second micro-lenses 13 may be formed prior to applying the sacrificial material 26. Convex micro-lens arrays may be formed by known micro-lens fabrication methods (not illustrated herein). A known method for forming second micro-lenses of convex shape is by applying a lower photo resist 24 to the second micro-lens material 23, then masking and exposing away part of the lower photo resist 24 to develop first openings therein, then heating the second micro-lens material 23 and lower photo resist 24 according to conventional methods such that the surface tension caused by the presence of the undeveloped lower photo resist 24 causes the underlying second micro-lens material 23 to form a second micro-lens array 12 of convex micro-lenses 13. A sacrificial material 26 may be applied to the second micro-lens array 12. Then first micro-lens array 14 and cavity 16a may then be formed in the manner described with reference to FIGS. 10, and 10a-10c (except that sacrificial material 26 is applied to the second micro-lens array rather than to the upper layer (e.g., M1 layer) of substrate 22).

Figure 11:
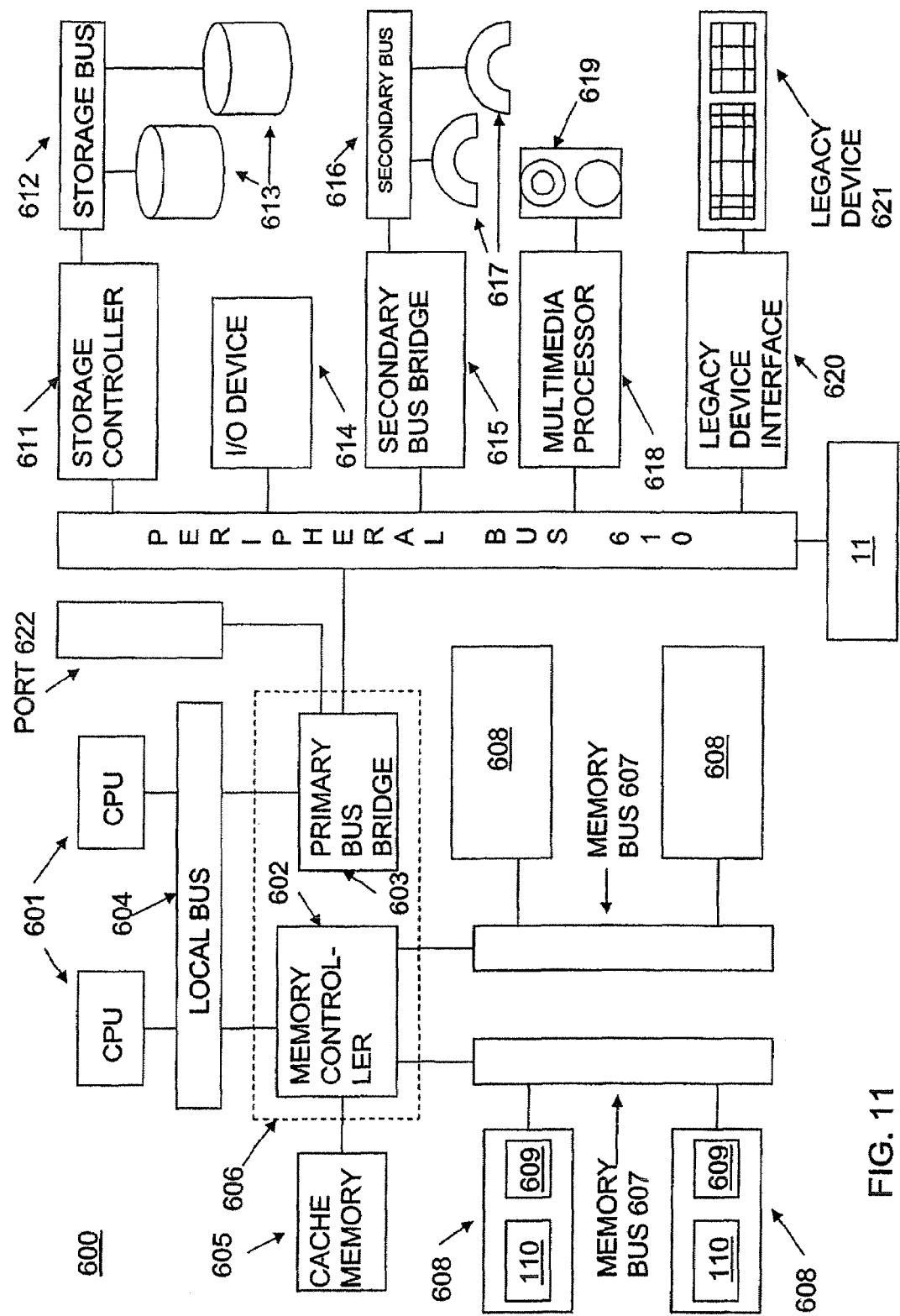
FIG. 11 is a schematic diagram of a processor system incorporating an image sensor comprising a plurality of micro-lenses constructed in accordance with an exemplary embodiment of the invention.

FIG. 11 illustrates an exemplary processing system 600 that may utilize the image sensor of the invention. For example, the image sensor 11 of FIG. 3, incorporating first micro-lens array 14 and second micro-lens array 12 constructed in accordance with the embodiment of the invention illustrated in FIGS. 5a-5i may be part of the processing system 600. Other image sensors may be used in accordance with the present invention, for example, the image sensor 11 of FIG. 4, incorporating first micro-lens array 14 (constructed in accordance with the embodiment of the invention illustrated in FIGS. 7a-7g) may be used. Any one of the electronic components shown in FIG. 11, including CPU 601 and image sensor 11, may be fabricated as an integrated circuit for use in processing images.

The processing system 600 includes one or more processors 601 coupled to a local bus 604. A memory controller 602 and a primary bus bridge 603 are also coupled to the local bus 604. The processing system 600 may include multiple memory controllers 602 and/or multiple primary bus bridges 603. The memory controller 602 and the primary bus bridge 603 may be integrated as a single device 606.

The memory controller 602 is also coupled to one or more memory buses 607. Each memory bus accepts memory components 608 which include at least one memory device 110. The memory components 608 may be a memory card or a memory module. Examples of memory modules include single inline memory modules (SIMMs) and dual inline memory modules (DIMMs). The memory components 608 may include one or more additional devices 609. For example, in a SIMM or DIMM, the additional device 609 might be a configuration memory, such as a serial presence detect (SPD) memory. The memory controller 602 may also be coupled to a cache memory 605. The cache memory 605 may be the only cache memory in the processing system. Alternatively, other devices, for example, processors 601 may also include cache memories, which may form a cache hierarchy with cache memory 605. If the processing system 600 includes peripherals or controllers which are bus masters or which support direct memory access (DMA), the memory controller 602 may implement a cache coherency protocol. If the memory controller 602 is coupled to a plurality of memory buses 607, each memory bus 607 may be operated in parallel, or different address ranges may be mapped to different memory buses 607.

The primary bus bridge 603 is coupled to at least one peripheral bus 610. Various devices, such as peripherals or additional bus bridges may be coupled to the peripheral bus 610. These devices may include a storage controller 611, a miscellaneous I/O device 614, a secondary bus bridge 615, a multimedia processor 618, and a legacy device interface 620. The primary bus bridge 603 may also be coupled to one or more special purpose high speed ports 622. In a personal computer, for example, the special purpose port might be the Accelerated Graphics Port (AGP), used to couple a high performance video card to the processing system 600.

The storage controller 611 couples one or more storage devices 613, via a storage bus 612, to the peripheral bus 610. For example, the storage controller 611 may be a SCSI controller and storage devices 613 may be SCSI discs. The I/O device 614 may be any sort of peripheral. For example, the I/O device 614 may be a local area network interface, such as an Ethernet card. The secondary bus bridge may be used to interface additional devices via another bus to the processing system. For example, the secondary bus bridge 616 may be a universal serial port (USB) controller used to couple USB devices 617 via to the processing system 600. The multimedia processor 618 may be a sound card, a video capture card, or any other type of media interface, which may also be coupled to one additional device such as speakers 619. The legacy device interface 620 is used to couple legacy devices 621, for example, older styled keyboards and mice, to the processing system 600.

The processing system 600 illustrated in FIG. 11 is only an exemplary processing system with which the invention may be used. While FIG. 11 illustrates a processing architecture especially suitable for a general purpose computer, such as a personal computer or a workstation, it should be recognized that well known modifications can be made to configure the processing system 600 to become more suitable for use in a variety of applications. For example, many electronic devices which require processing may be implemented using a simpler architecture which relies on a CPU 601 coupled to memory components 608 and/or memory devices 110. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The imaging devices of the present invention, when coupled to a pixel processor, for example, may be implemented in digital cameras and video processors and recorders. Modifications may include, for example, elimination of unnecessary components, addition of specialized devices or circuits, and/or integration of a plurality of devices.

It should again be noted that although the invention has been described with specific references to CMOS pixel cells having a strained silicon layer, the invention has broader applicability and may be used in any image sensor device. For example, the present invention may be used in conjunction with CCD imagers. Similarly, the processes described above are but only a few methods of many that may be used. The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed is:

1. An image sensor comprising:
a plurality of pixels, each pixel comprising:
a first micro-lens formed over a substrate for capturing incoming light; and
a second micro-lens formed over the substrate for receiving the incoming light from the first micro-lens and focusing the incoming light onto a corresponding photo sensor formed within the substrate, wherein the first micro-lens is separated from the second micro-lens by a cavity, wherein a surface of one of the first and second micro-lenses abutting the cavity is convex and a surface of the other of the first and second micro-lenses abutting the cavity is concave.

2. The image sensor of claim 1 wherein said cavity is filled with air.

3. The image sensor of claim 1 wherein said first micro-lens is comprised of a first micro-lens material selected from the group consisting of silicon dioxide, silicon nitride, plasma enhanced chemical vapor deposition (PECVD) oxides, interlayer dielectric materials, and BoroPhosphoSilicate Glass (BPSG).

4. The image sensor of claim 1 wherein said second micro-lens is comprised of a second micro-lens material selected from the group consisting of silicon dioxide, silicon nitride, plasma enhanced chemical vapor deposition (PECVD) oxides, interlayer dielectric materials, and BoroPhosphoSilicate Glass (BPSG).

5. The image sensor of claim 1 wherein the surface of the first micro-lens abutting the cavity is concave.

6. The image sensor of claim 5 wherein the surface of the second micro-lens abutting the cavity is convex.

7. The image sensor of claim 1 wherein the surface of the first micro-lens abutting the cavity is convex.

8. The image sensor of claim 7 wherein the surface of the second micro-lens abutting the cavity is concave.

9. The image sensor of claim 1 further comprising a colored filter formed on top of said first micro-lens.

10. The image sensor of claim 9 further comprising a protective layer positioned on top of the colored filter.

11. The image sensor of claim 3, further comprising one or more posts for supporting the first micro-lens relative to the second micro-lens.

12. The image sensor of claim 11 wherein said one or more posts are positioned at one or more edges of the image sensor.

13. The image sensor of claim 11 wherein said one or more posts are positioned internal to edges of the image sensor.

14. The image sensor of claim 13 wherein said one or more posts are comprised of said first micro-lens material.

15. The image sensor of claim 3 wherein said one or more supports are one or more support walls positioned at one or more edges of the image sensor.

16. The image sensor of claim 15 wherein said one or more support walls are comprised of said first micro-lens material.

17. The image sensor of claim 1, further comprising one or more supports for supporting the first micro-lens relative to the second micro-lens.

18. An imager system comprising:
a processor; and
an image sensor electrically coupled to said processor, said image sensor comprising a plurality of pixels, each pixel comprising:
a first micro-lens formed over a substrate for capturing incoming light;
a second micro-lens positioned along an optical path for receiving the incoming light from the first micro-lens and focusing the incoming light onto a corresponding photo sensor, wherein the first micro-lens is separated from the second micro-lens by a cavity, wherein a surface of one of the first and second micro-lenses abutting the cavity is convex and a surface of the other of the first and second micro-lenses abutting the cavity is concave;
a colored filter positioned along said optical path; and
one or more supports for supporting the first micro-lens relative to the second micro-lens.

19. The imager system of claim 18 wherein said cavity is filled with air.

20. The imager system of claim 18 wherein said one or more supports comprise one or more posts.

21. The imager system of claim 20 wherein said one or more posts are positioned at one or more edges of the image sensor.

22. The imager system of claim 20 wherein said one or more posts are positioned internal to edges of the image sensor.

23. The imager system of claim 22 wherein said one or more posts are comprised of the first micro-lens material.

24. The imager system of claim 18 wherein said one or more supports are one or more support walls positioned at one or more edges of the image sensor.

25. The imager system of claim 24 wherein said one or more support walls are comprised of said first micro-lens material.

* * * * *